(12) United States Patent
Zaitsu et al.

(10) Patent No.: US 9,263,463 B2
(45) Date of Patent: *Feb. 16, 2016

(54) SEMICONDUCTOR INTEGRATED CIRCUIT, PROGRAMMABLE LOGIC DEVICE, METHOD OF MANUFACTURING SEMICONDUCTOR INTEGRATED CIRCUIT

(71) Applicant: KABUSHIKI KAISHA TOSHIBA, Minato-ku, Tokyo (JP)

(72) Inventors: Koichiro Zaitsu, Kawasaki (JP); Kosuke Tatsumura, Kawasaki (JP); Mari Matsumoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/500,349

(22) Filed: Sep. 29, 2014

(65) Prior Publication Data

US 2015/0014748 A1 Jan. 15, 2015

Related U.S. Application Data

(63) Continuation of application No. 13/622,015, filed on Sep. 18, 2012, now Pat. No. 8,860,459.

(30) Foreign Application Priority Data

Aug. 1, 2012 (JP) .................................. 2012-171219

(51) Int. Cl.
*H03K 19/177* (2006.01)
*G06F 7/38* (2006.01)
(Continued)

(52) U.S. Cl.
CPC .......... *H01L 27/11803* (2013.01); *G11C 16/04* (2013.01); *G11C 16/0441* (2013.01); *G11C 16/10* (2013.01); *H01L 21/28273* (2013.01); *H01L 21/28282* (2013.01); *H01L 27/0207* (2013.01); *H01L 27/11526* (2013.01); *H01L 27/11534* (2013.01); *H01L 27/11573* (2013.01); *H01L 29/6659* (2013.01);
(Continued)

(58) Field of Classification Search
None
See application file for complete search history.

(56) References Cited

U.S. PATENT DOCUMENTS 5,812,450 A 9/1998 Sansbury et al.
6,002,610 A 12/1999 Cong et al.
(Continued)

OTHER PUBLICATIONS

Eitan et al., "NROM: A Novel Localized Trapping, 2-Bit Nonvolatile Memory Cell," IEEE Electron Device Letters (Nov. 2000), 21:543-545.

(Continued)

*Primary Examiner* — Jany Richardson
(74) *Attorney, Agent, or Firm* — Finnegan, Henderson, Farabow, Garrett & Dunner, LLP

(57) ABSTRACT

According to one embodiment, a semiconductor integrated circuit includes nonvolatile memory areas, each includes a first nonvolatile memory transistor, a second nonvolatile memory transistor and an output line, the first nonvolatile memory transistor includes a first source diffusion region, a first drain diffusion region and a first control gate electrode, the second nonvolatile memory transistor includes a second source diffusion region, a second drain diffusion region and a second control gate electrode, the output line connected the first drain diffusion region and the second drain diffusion region, and logic transistor areas, each includes a logic transistor, the logic transistor includes a third source diffusion region, a third drain diffusion region and a first gate electrode.

21 Claims, 25 Drawing Sheets

(51) Int. Cl.

| | |
|---|---|
| *H01L 27/118* | (2006.01) |
| *G11C 16/04* | (2006.01) |
| *H01L 21/28* | (2006.01) |
| *H01L 29/66* | (2006.01) |
| *H01L 27/02* | (2006.01) |
| *H01L 29/788* | (2006.01) |
| *H01L 29/792* | (2006.01) |
| *H01L 27/115* | (2006.01) |
| *G11C 16/10* | (2006.01) |
| *H01L 21/265* | (2006.01) |

(52) U.S. Cl.
CPC ... *H01L 29/66537* (2013.01); *H01L 29/66825* (2013.01); *H01L 29/66833* (2013.01); *H01L 29/7881* (2013.01); *H01L 29/792* (2013.01); *H03K 19/17764* (2013.01); *H03K 19/17792* (2013.01); *H01L 21/26586* (2013.01); *H01L 29/6653* (2013.01)

(56) References Cited

U.S. PATENT DOCUMENTS

| | | | |
|---|---|---|---|
| 6,970,383 B1* | 11/2005 | Han et al. | 365/185.28 |
| 2012/0080739 A1* | 4/2012 | Hagishima et al. | 257/324 |
| 2013/0222011 A1* | 8/2013 | Zaitsu et al. | 326/41 |
| 2013/0307054 A1* | 11/2013 | Yasuda et al. | 257/326 |
| 2014/0061765 A1* | 3/2014 | Zaitsu et al. | 257/324 |

OTHER PUBLICATIONS

Kita et al., "Intrinsic Origin of Electric Dipoles Formed at High-k/$SiO_2$ Interface," Proceedings of IEEE International Electron Device Meeting 2008.

Tatsumura et al., U.S. Appl. No. 13/469,867, filed May 11, 2012.

Yasuda et al., U.S. Appl. No. 13/606,292, filed Sep. 7, 2012.

* cited by examiner

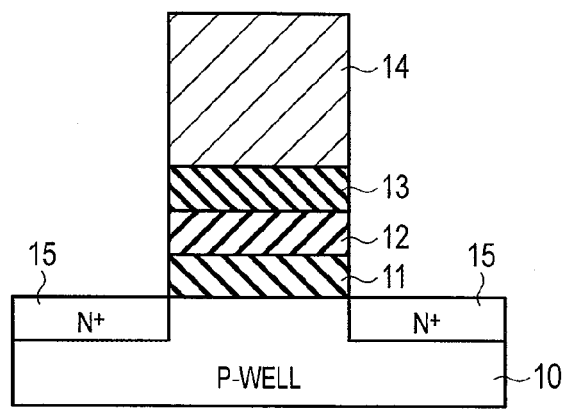
F I G. 1A
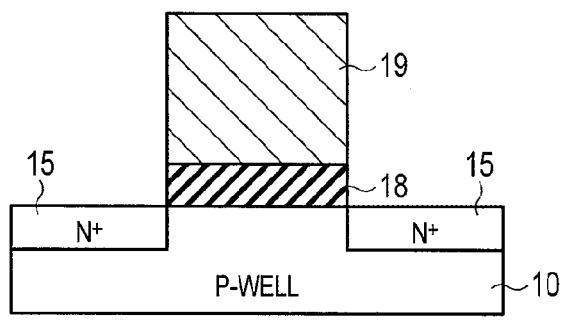
F I G. 1B
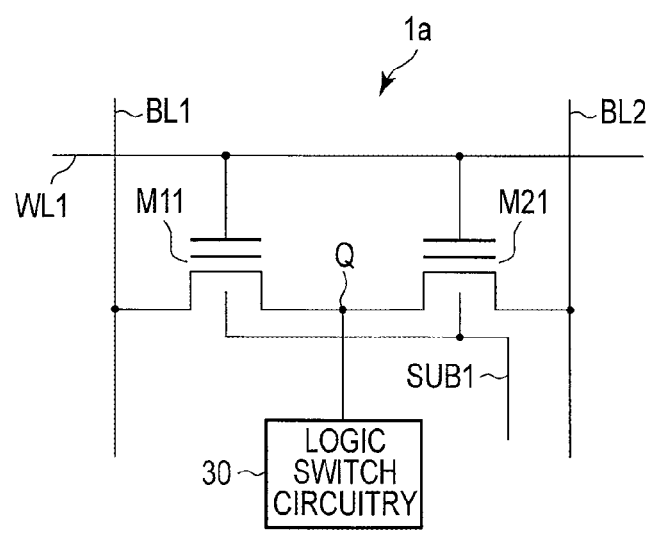
F I G. 2

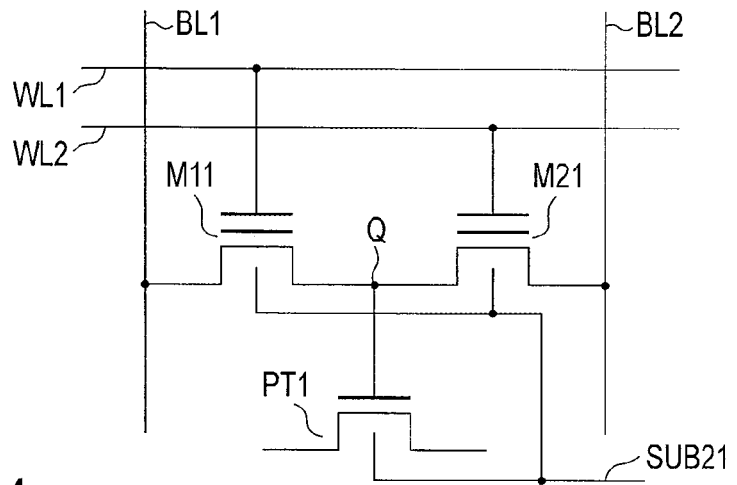
F I G. 4
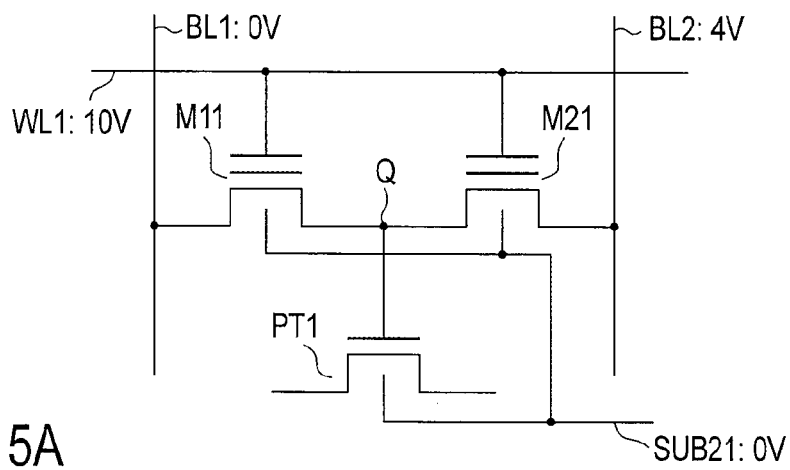
F I G. 5A
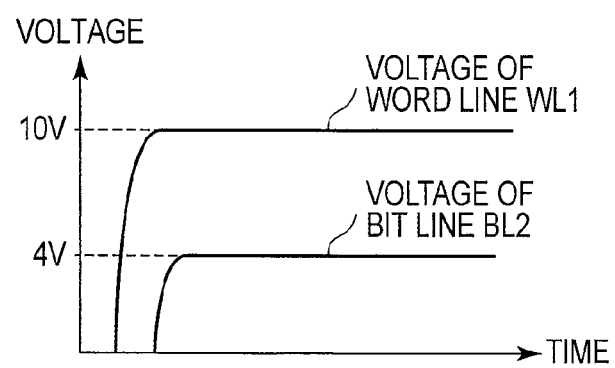
F I G. 5B

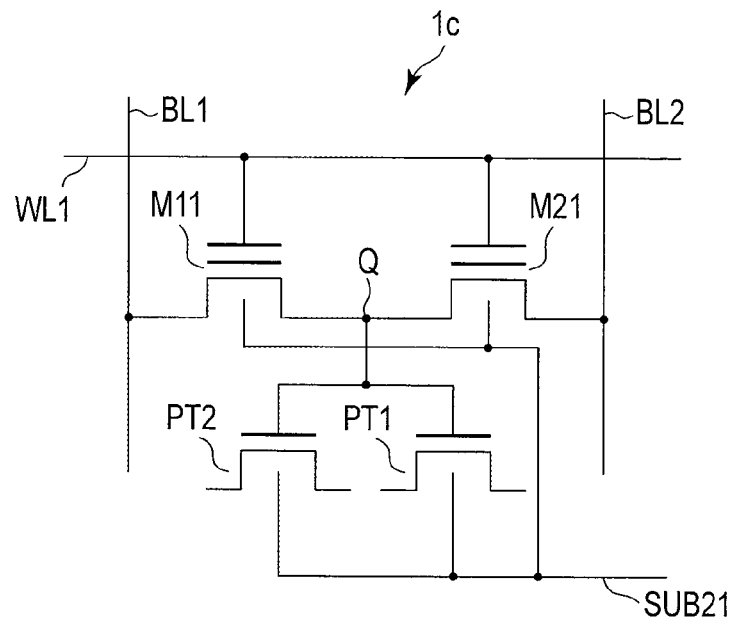
F I G. 10
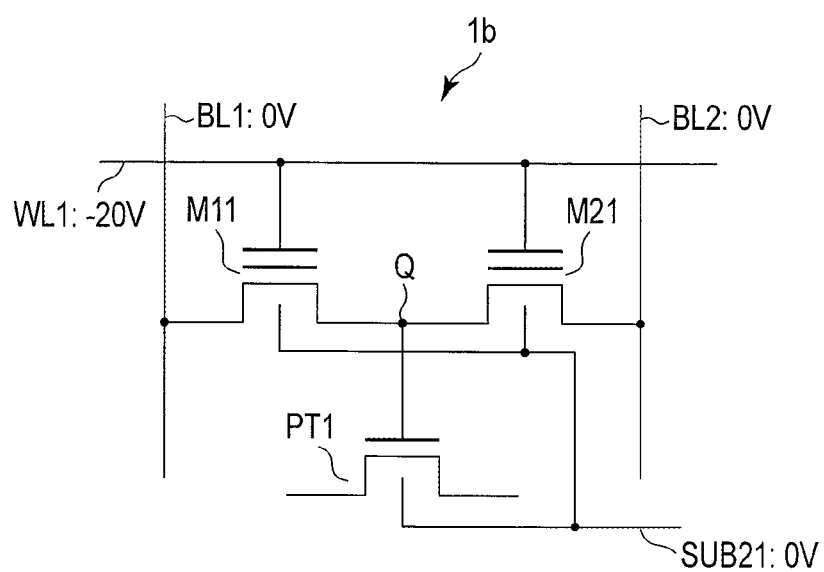
F I G. 11

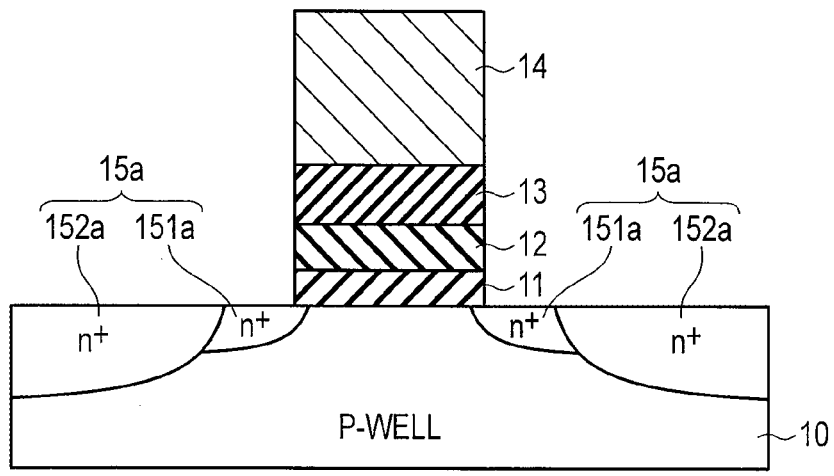
F I G. 14A
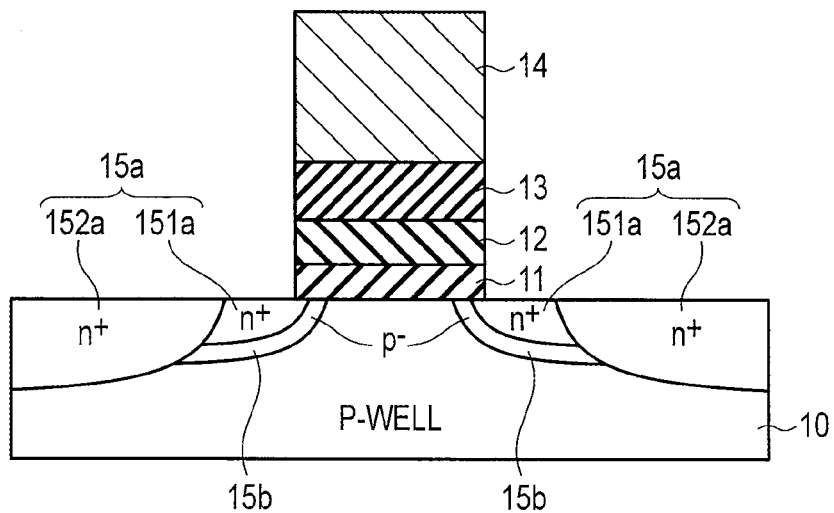
F I G. 14B

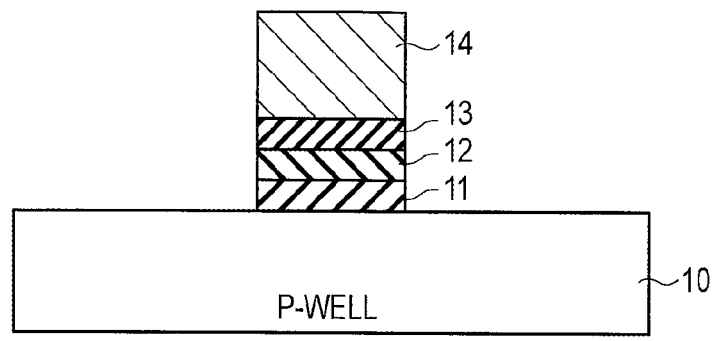
F I G. 15
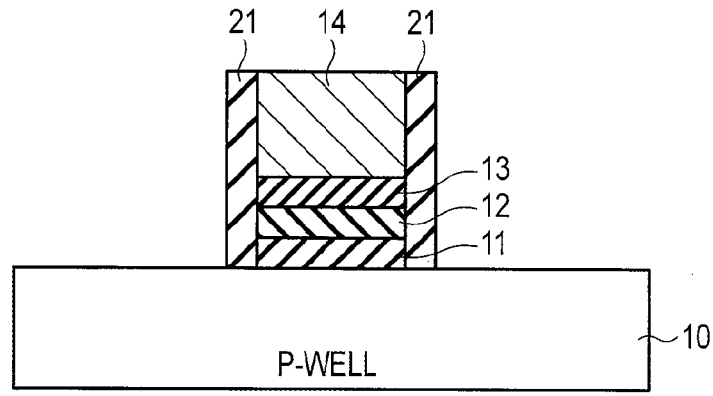
F I G. 16
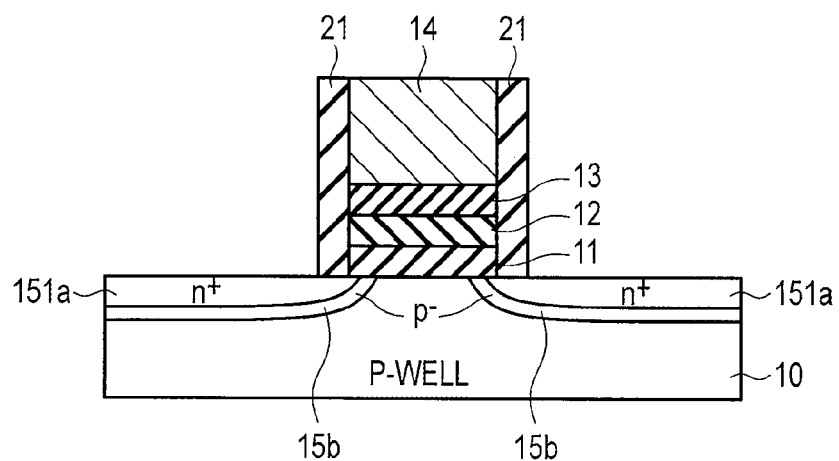
F I G. 17

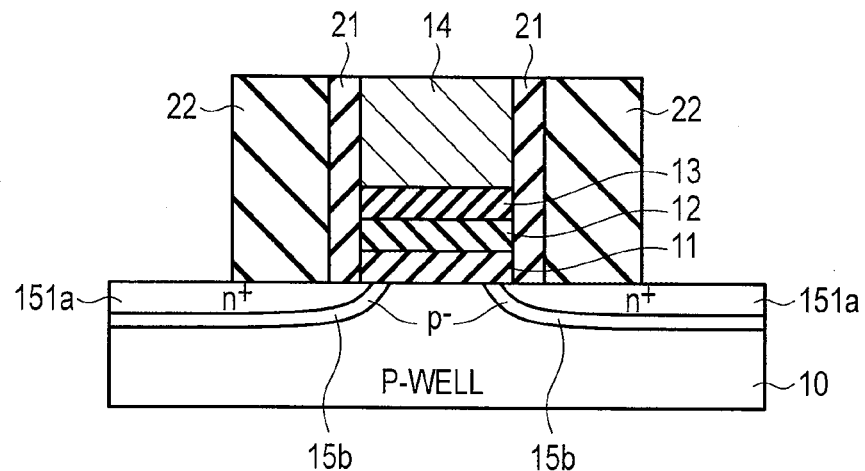
F I G. 18
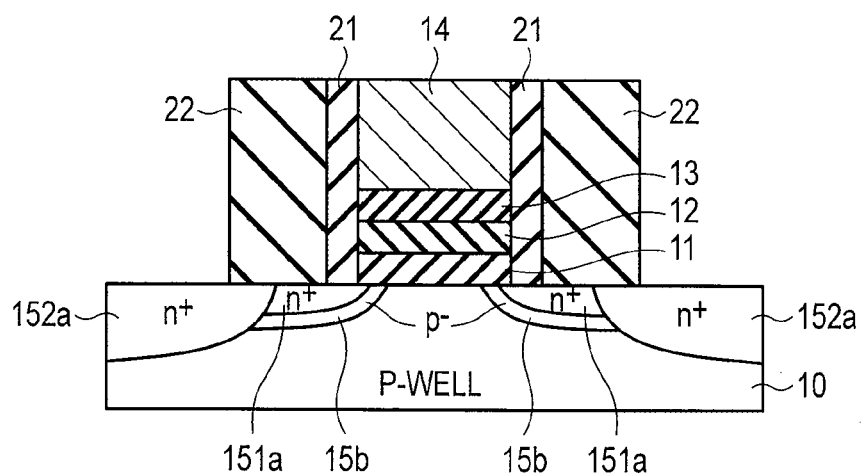
F I G. 19

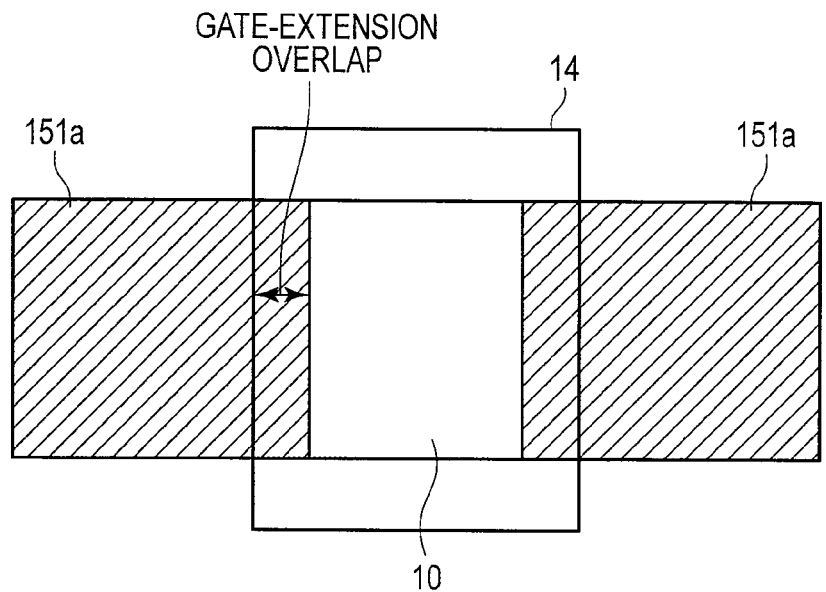
F I G. 20
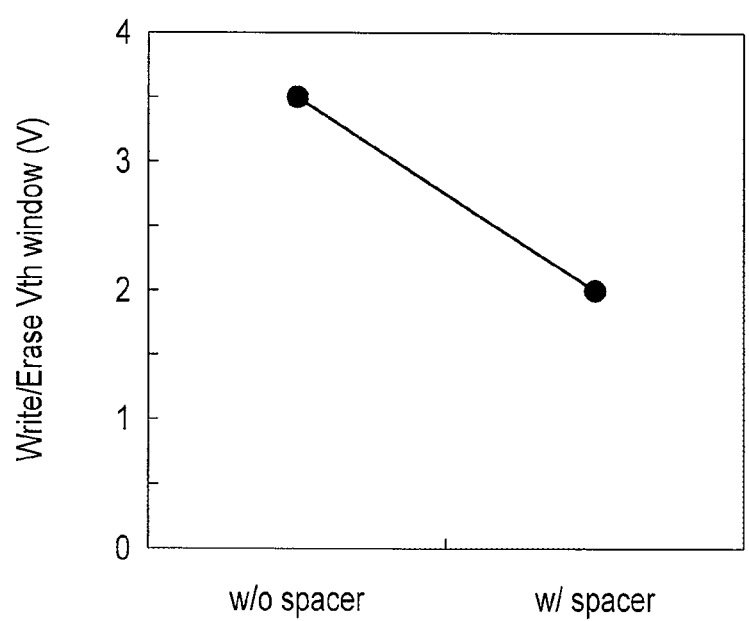
F I G. 21

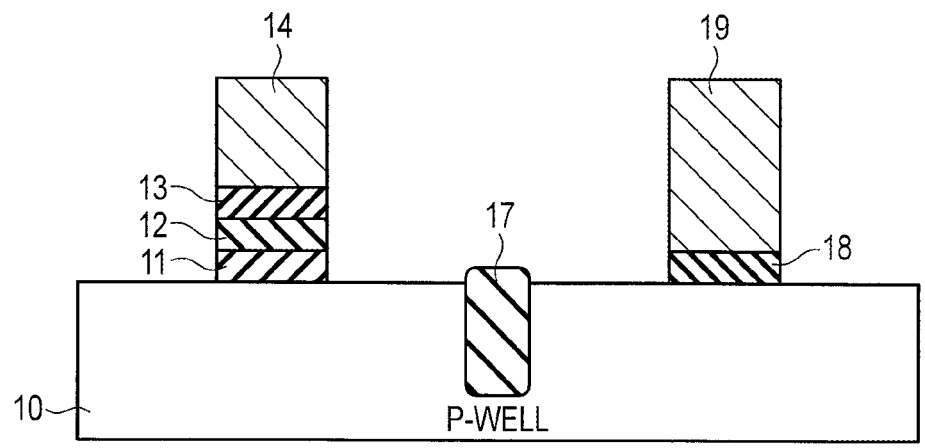
F I G. 22
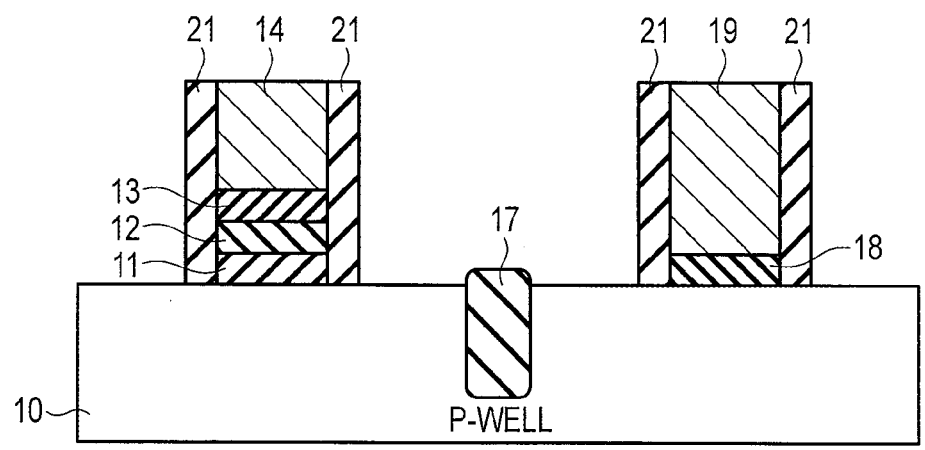
F I G. 23

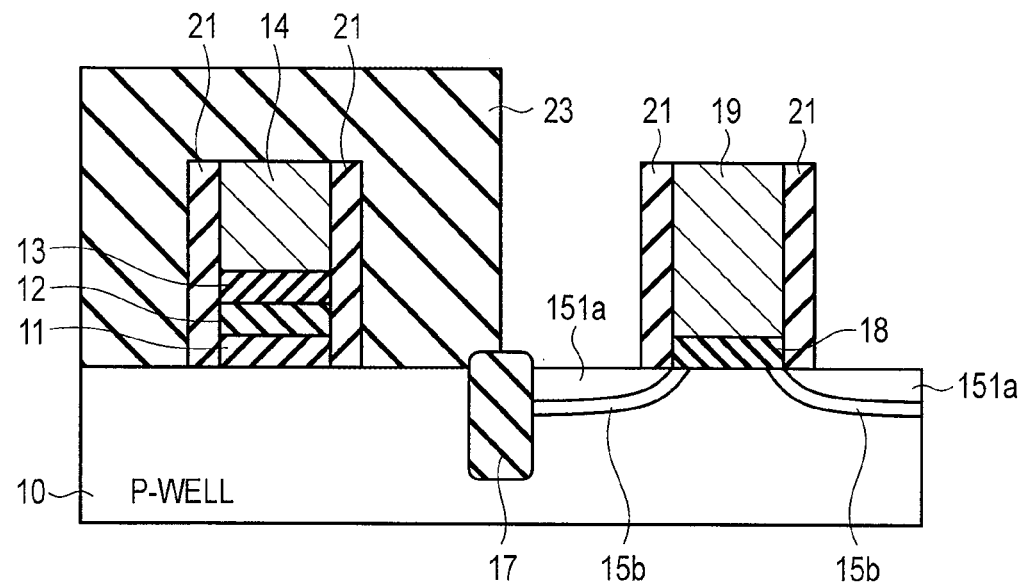
F I G. 24
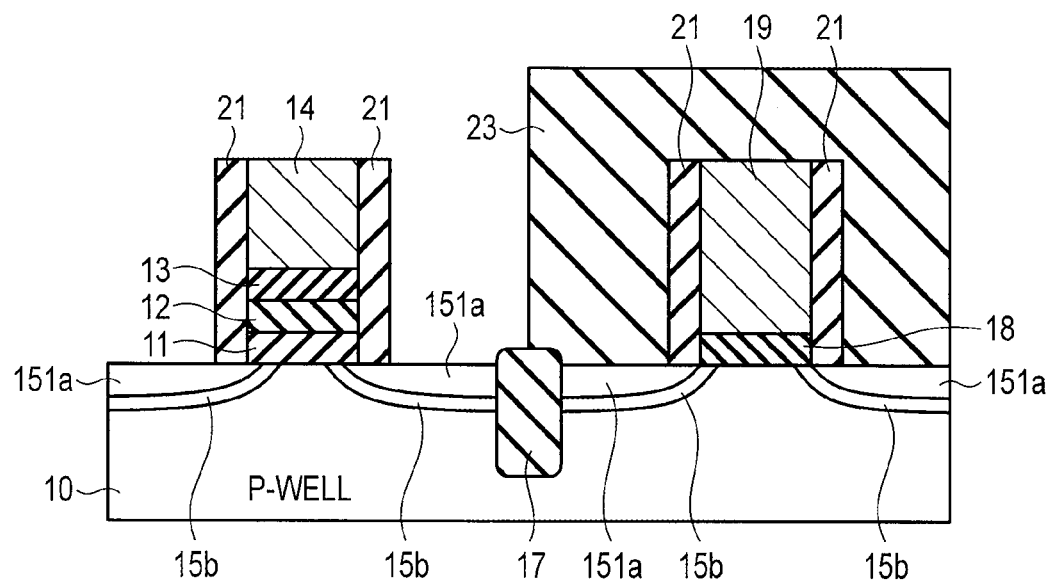
F I G. 25

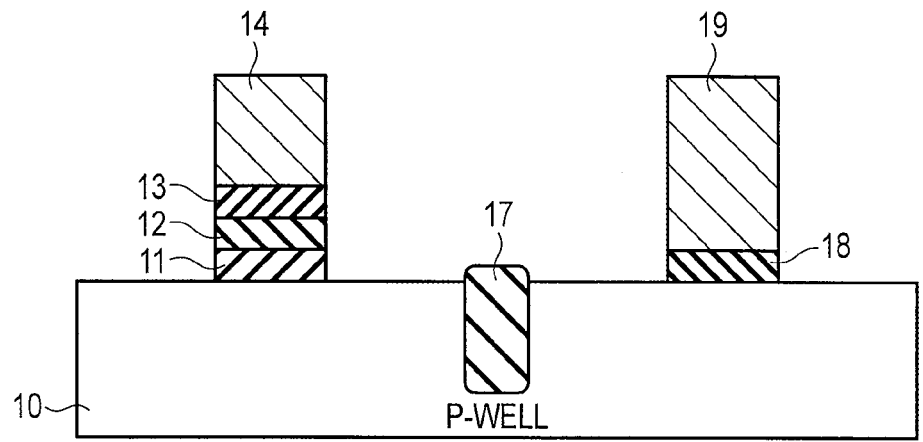
F I G. 26
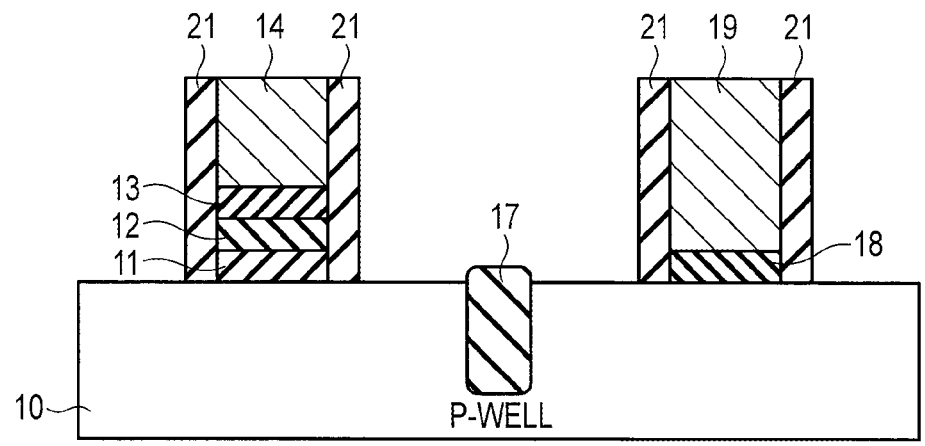
F I G. 27

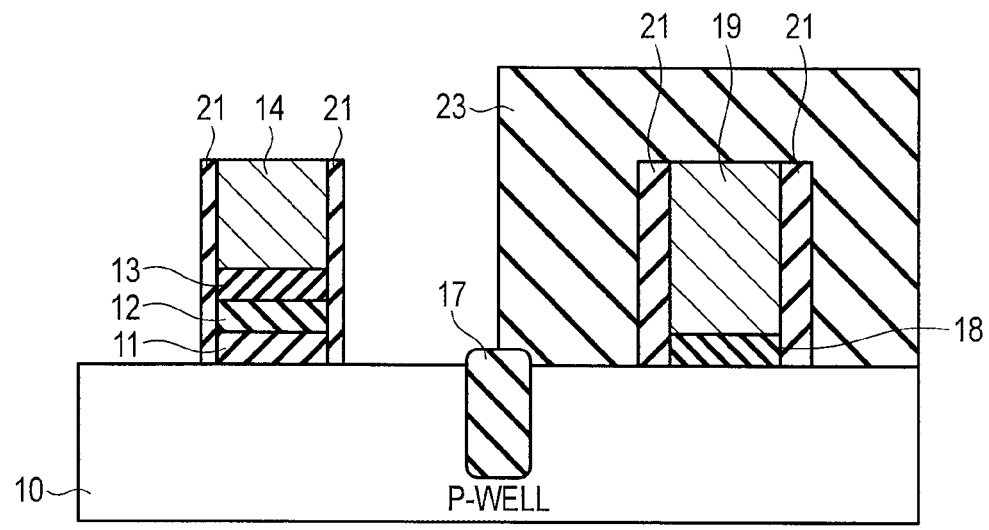
F I G. 28
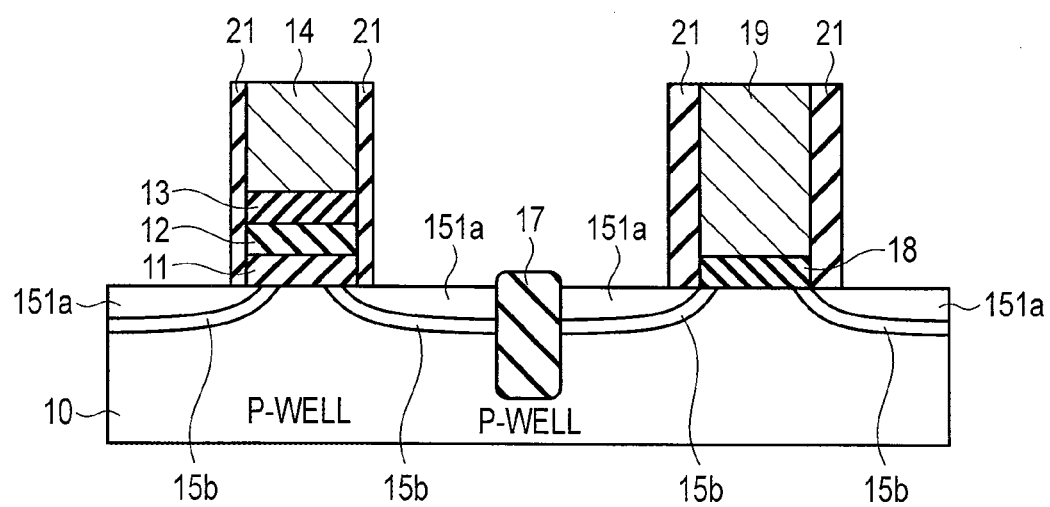
F I G. 29

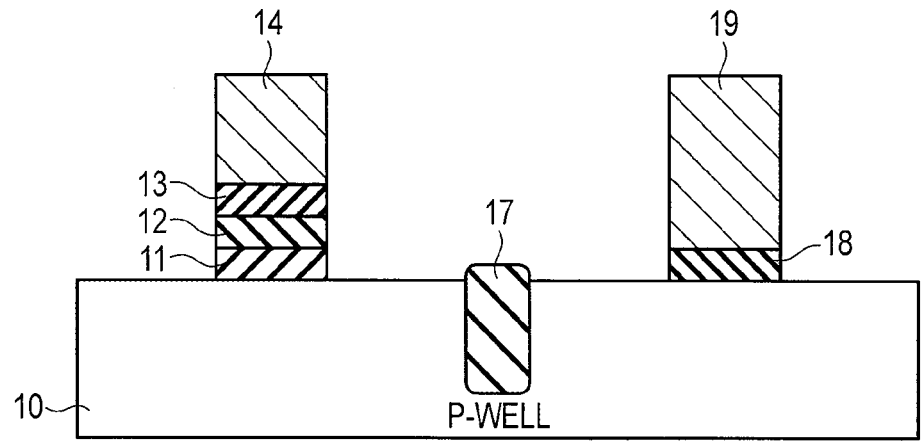
F I G. 30
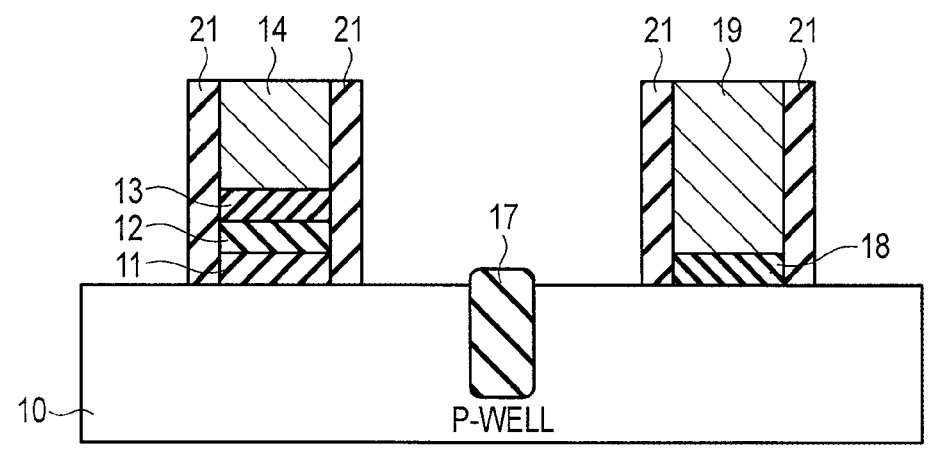
F I G. 31

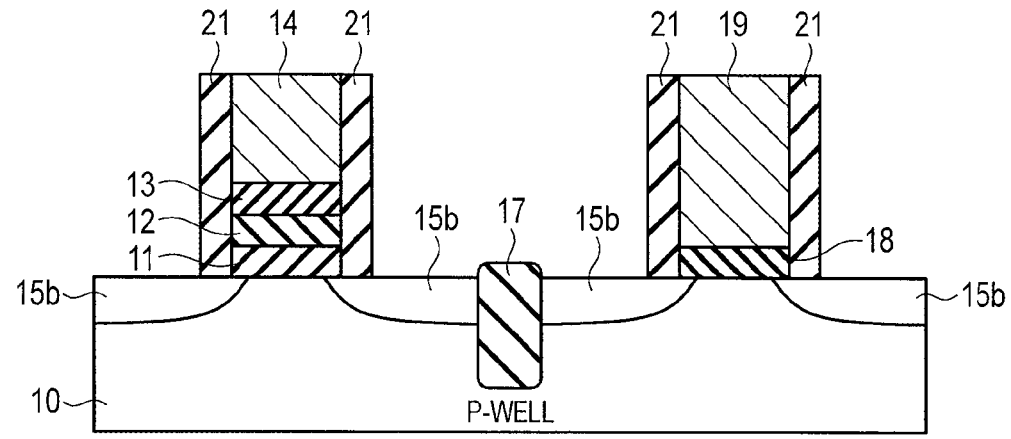
F I G. 32
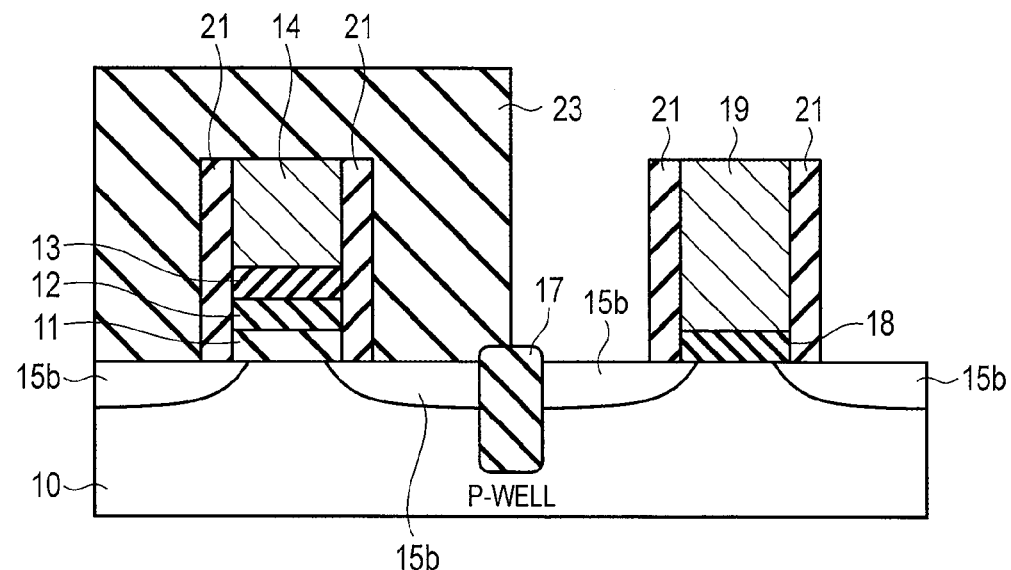
F I G. 33

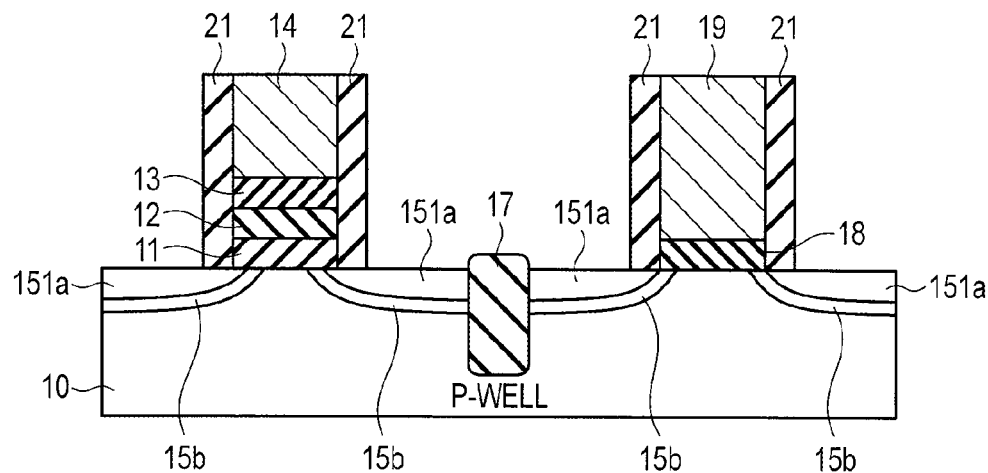
F I G. 34
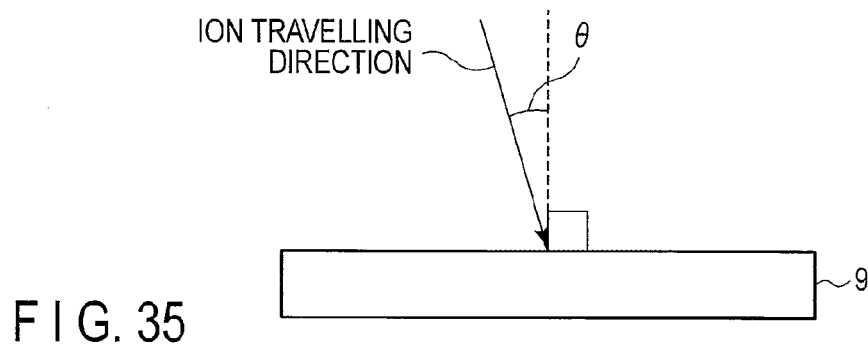
F I G. 35
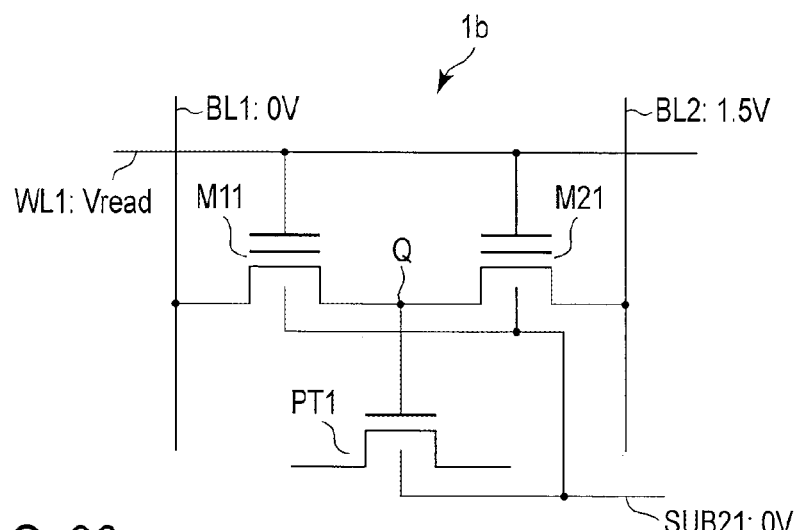
F I G. 36

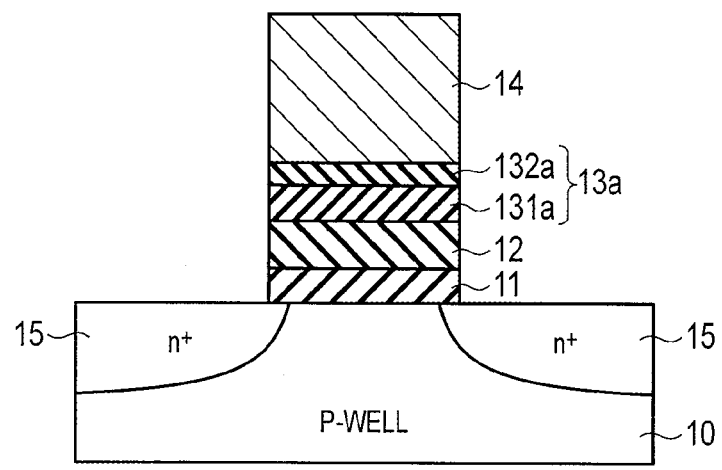
F I G. 37
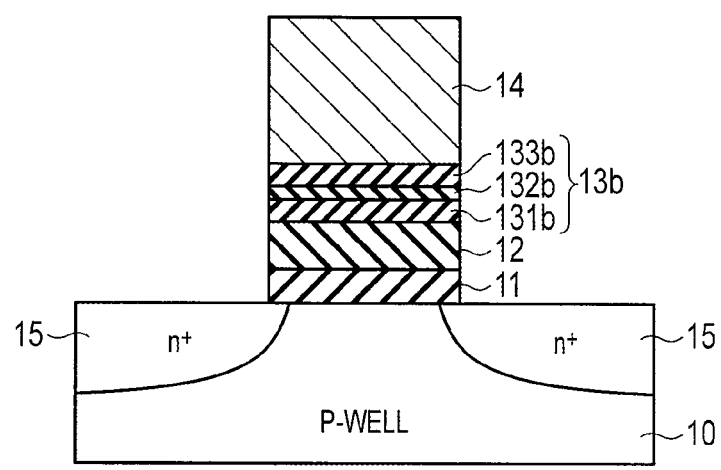
F I G. 38

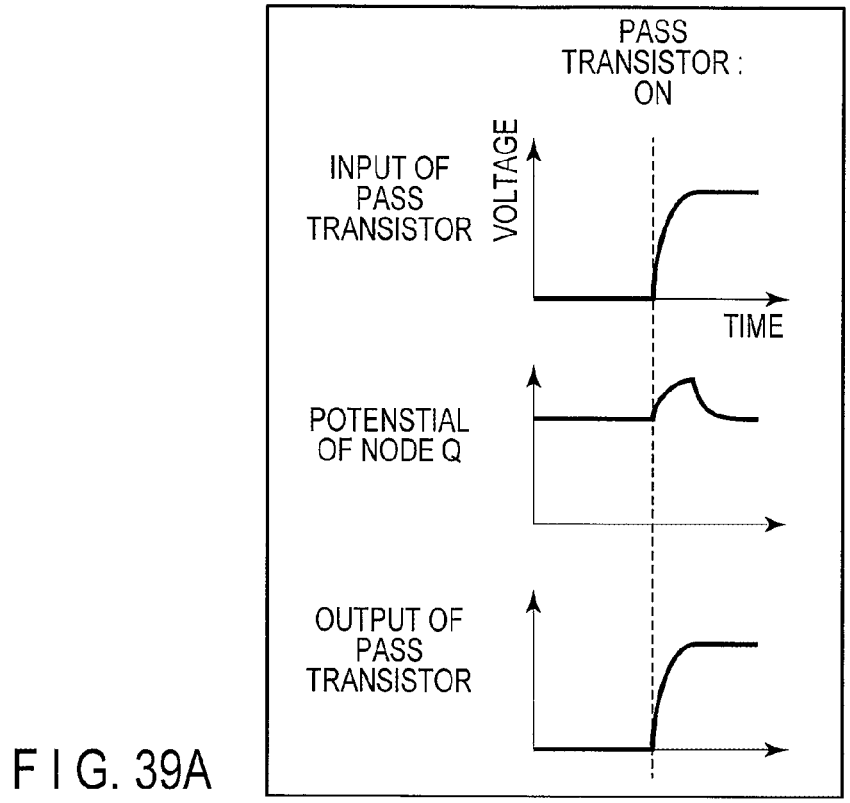
F I G. 39A
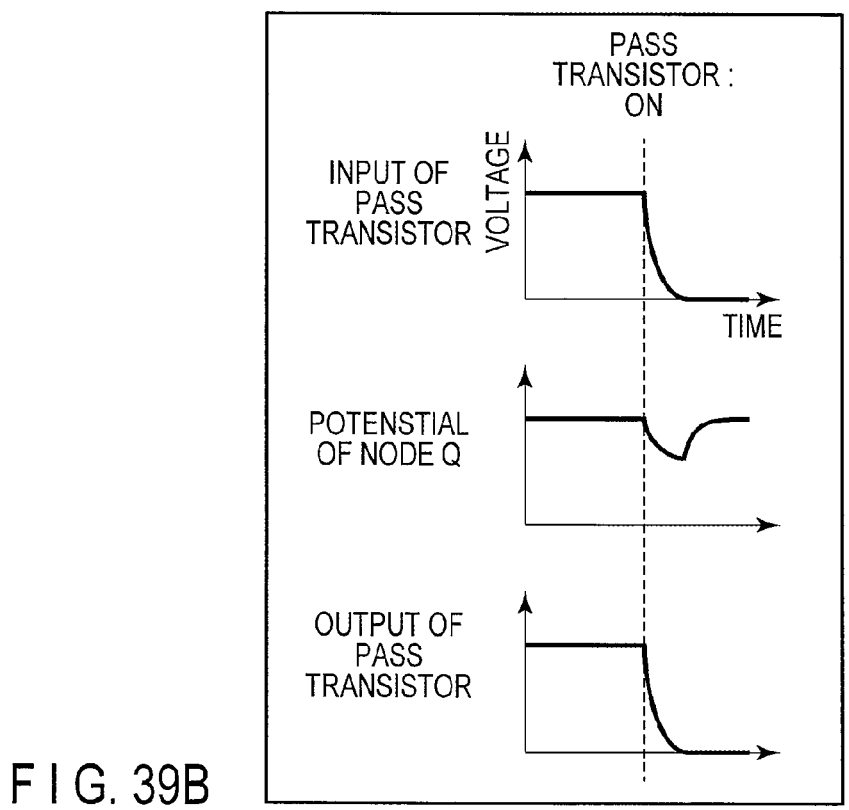
F I G. 39B

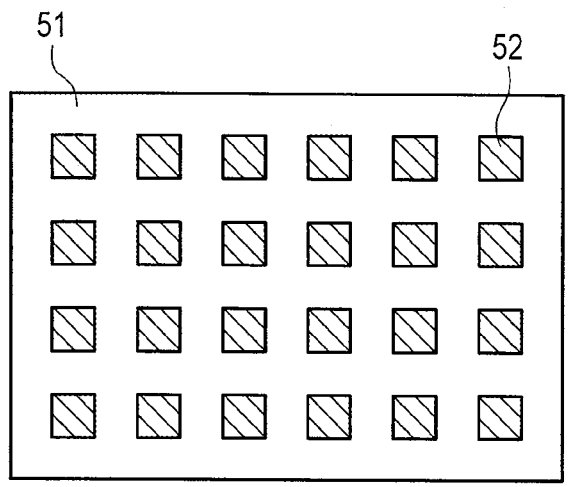
F I G. 40A
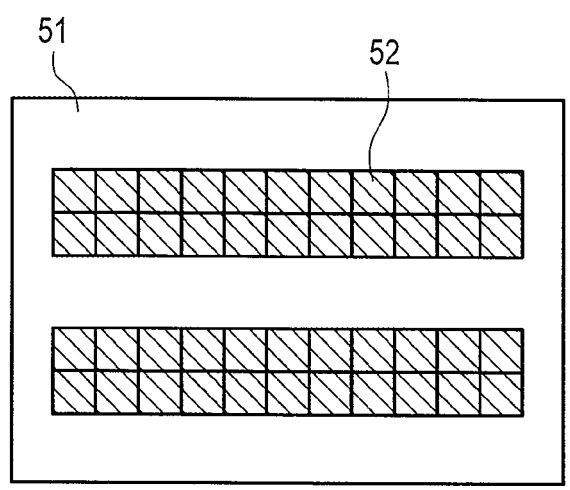
F I G. 40B

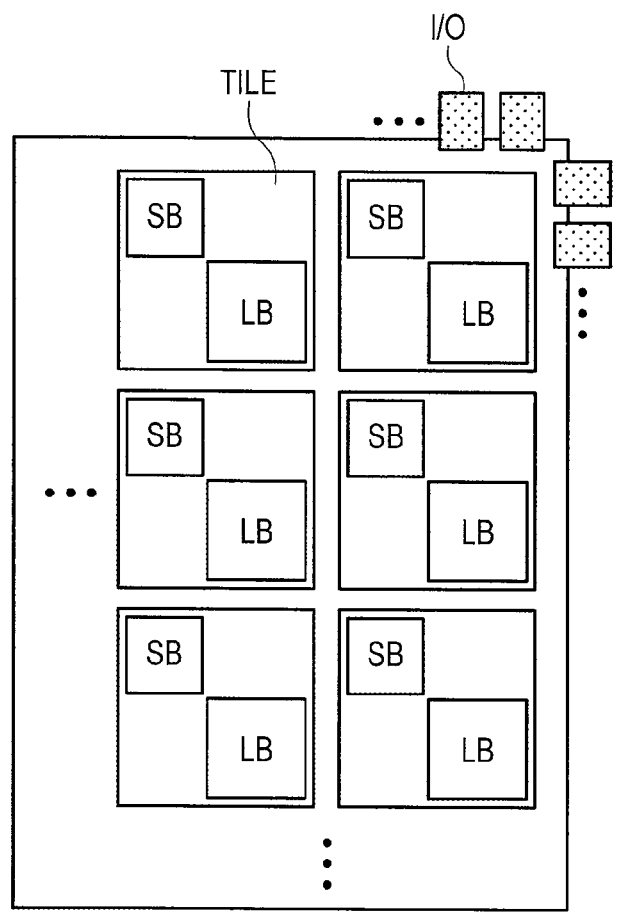
F I G. 41
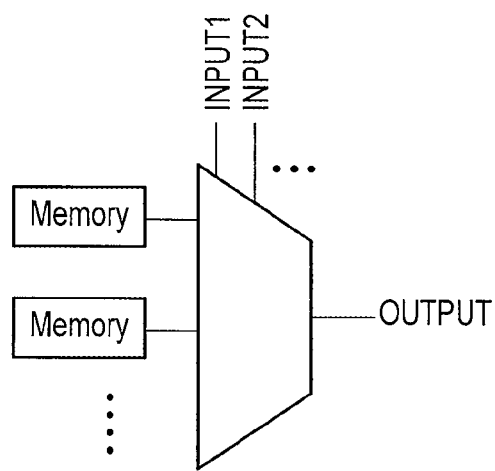
F I G. 42

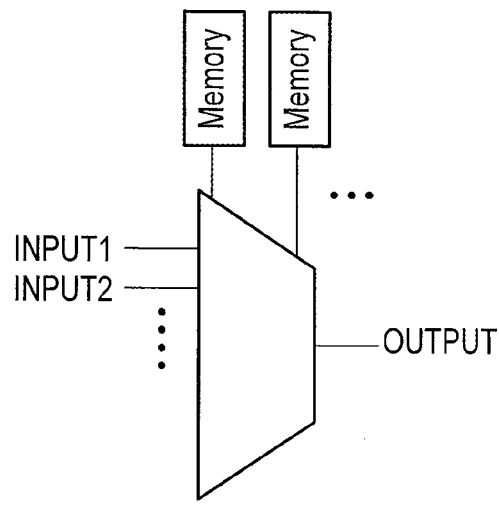
F I G. 43
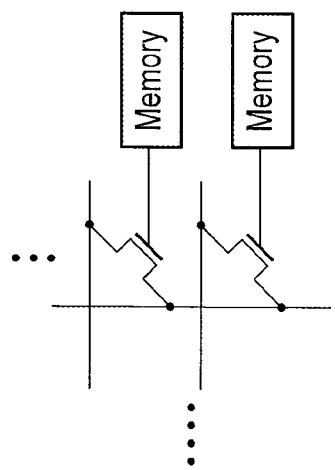
F I G. 44

SEMICONDUCTOR INTEGRATED CIRCUIT, PROGRAMMABLE LOGIC DEVICE, METHOD OF MANUFACTURING SEMICONDUCTOR INTEGRATED CIRCUIT

CROSS-REFERENCE TO RELATED APPLICATIONS

This application is a continuation of application Ser. No. 13/622,015, filed Sep. 18, 2012, and based upon and claims the benefit of priority from Japanese Patent Application No. 2012-171219, filed Aug. 1, 2012, the entire contents of both of which are incorporated herein by reference.

FIELD

Embodiments described herein relate generally to a semiconductor integrated circuit.

BACKGROUND

A programmable logic switch is a device for controlling ON/OFF states of a logic switch (for example, transistor and the like) in accordance with data held in a memory. In general, the programmable logic switch is used for a programmable logic device (For example, an FPGA (Field Programmable Gate Array) and the like) that requires reconfiguration of a logic operational circuit and an interconnection circuit.

A programmable logic switch used in a conventional FPGA uses a volatile memory such as an SRAM. For this reason, data saved in the memory is lost when the power is turned off. Therefore, when the power is turned on again, there is a problem in that it is necessary to read the data from a separately provided memory region again. In general, the SRAM includes six transistors. Therefore, an FPGA using many SRAMs has a problem in that the chip size increases.

For this problem, a programmable logic switch using a nonvolatile flash memory is known. For example, a memory cell of the FPGA includes a first nonvolatile memory device and a second nonvolatile memory device which are connected in series. A contact point between a first nonvolatile memory device and a second nonvolatile memory device serves as an output node Q of the memory cell. The output node Q is connected to an NMOS transistor and a switching transistor.

When an integrated circuit having both the nonvolatile memory device and the switching transistor in a mixed manner is achieved, the manufacturing process of the switching transistor and the manufacturing process of the nonvolatile memory device should be preferably similar to each other. This is because, if the nonvolatile memory device and the switching transistor can be made with a similar process, both of them can be arranged in proximity to each other within the chip, and the size of area can be reduced which reduces the lengths of wires (conductive lines), and moreover, this improves the operation speed.

However, different performances and voltage conditions are required of the nonvolatile memory device and the switching transistor, and it is not desirable for both of them to have the same impurity concentration in the semiconductor, gate length, and the like. In order to achieve a high-performance nonvolatile programmable switch at a low cost, manufacturing processes (conditions) of the nonvolatile memory device and that of the switching transistor are respectively optimized, and further, they also need to be similar to each other. A nonvolatile programmable switch for achieving such high-performance and low cost has not been sufficiently studied.

BRIEF DESCRIPTION OF THE DRAWINGS

FIGS. 1A and 1B are figures illustrating a nonvolatile memory transistor and a logic transistor;

FIG. 2 is a figure illustrating an example of a semiconductor integrated circuit;

FIG. 4 is a figure illustrating an example of a semiconductor integrated circuit;

FIGS. 5A and 5B are figures illustrating an example of a semiconductor integrated circuit;

FIGS. 9 to 12 are figures, each illustrating an example of a semiconductor integrated circuit;

FIGS. 14A and 14B are figures illustrating a nonvolatile memory transistor;

FIGS. 15 to 19 are figures, each illustrating a method for manufacturing a semiconductor integrated circuit;

FIG. 20 is a figure illustrating a gate-extension overlap;

FIG. 21 is a figure illustrating change of a threshold voltage window caused by a spacer;

FIGS. 22 to 34 are figures, each illustrating a method for manufacturing a semiconductor integrated circuit;

FIG. 35 is a figure illustrating a tilt angle θ;

FIG. 36 is a figure illustrating an example of a semiconductor integrated circuit;

FIGS. 37 and 38 are figures, each illustrating a nonvolatile memory transistor;

FIGS. 39A, 39B, 39C and 39D are figures illustrating fluctuation of a potential of an output line;

FIGS. 40A and 40B are figures illustrating nonvolatile memory transistors and logic transistors provided in proximity in a mixed manner;

FIGS. 41 to 44 are figures, each illustrating an FPGA serving as an example of application.

DETAILED DESCRIPTION

Figure 3A:
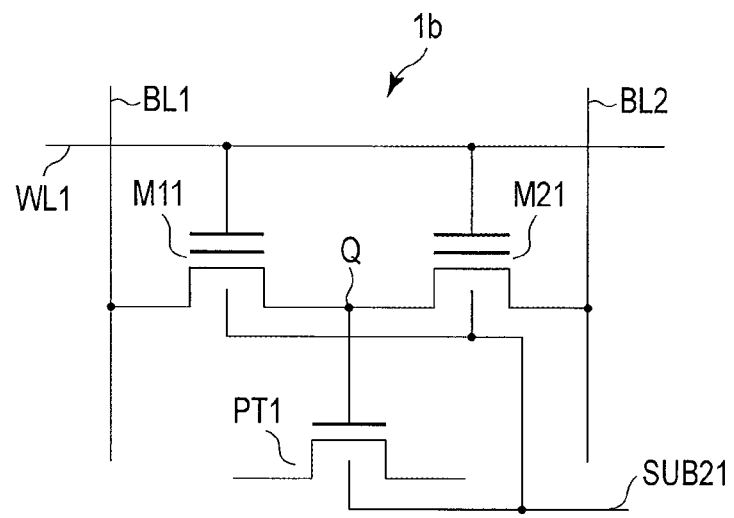
FIGS. 3A and 3B are figures illustrating an example of a semiconductor integrated circuit.

In general, according to one embodiment, a semiconductor integrated circuit comprising: nonvolatile memory areas, each comprising a first nonvolatile memory transistor, a second nonvolatile memory transistor and an output line, the first nonvolatile memory transistor comprising a first source diffusion region, a first drain diffusion region and a first control gate electrode, the second nonvolatile memory transistor comprising a second source diffusion region, a second drain diffusion region and a second control gate electrode, the output line connected the first drain diffusion region and the second drain diffusion region; and logic transistor areas, each comprising a logic transistor whose conductive type is same as the first nonvolatile memory transistor, the logic transistor comprising a third source diffusion region, a third drain diffusion region and a first gate electrode, wherein the nonvolatile memory areas and the logic transistor areas are arranged on a substrate, a height of a lower surface of the first gate electrode from an upper surface of the substrate is lower than a height of each of lower surfaces of the first and second control gate electrodes from the upper surface of the substrate, and a length of an overlapping area of the first source diffusion region and the first control gate electrode in a direction parallel to a channel of the first nonvolatile memory transistor is larger than a length of an overlapping area of the third source diffusion region and the first gate electrode in a direction parallel to a channel of the logic transistor, when seen from the upper surface of the substrate.

Hereinafter, embodiments will be described with reference to the drawings.

[First Embodiment]

Two kinds of transistors, i.e., a flash memory transistor (hereinafter simply referred to as a memory transistor) and a logic transistor are provided in the inside of the semiconductor integrated circuit according to the present embodiment.

FIGS. 1A and 1B illustrate an example of structures of a nonvolatile memory transistor and a logic transistor. FIG. 1A illustrates the structure of the memory transistor. FIG. 1B illustrates the structure of the logic transistor.

The memory transistor typically has a charge storage film, and stores data according to the amount of charge accumulated in the charge storage film. The memory transistor may be an FG (Floating Gate)-type transistor using a conductive floating gate (for example, polysilicon doped in N-type and polysilicon doped in P-type), or may be a MONOS (Metal-Oxide-Nitride-Oxide-Semiconductor)-type transistor using a film of an insulating silicon nitride or an insulating silicon oxynitride as a charge storage film, or may have a charge storage film in which an insulating silicon nitride or a silicon oxynitride are laminated on a conductive polysilicon.

Among these transistors, a manufacturing process of the MONOS-type transistor is very similar to that of the logic transistor, thus the memory transistor and the logic transistor can be arranged in proximity to each other compared with the case where an FG-type transistor is used. Accordingly, the chip size can be reduced.

FIG. 1A is an example of structure when an MONOS-type transistor is used as the memory transistor. The memory transistor has a gate structure obtained by laminating first insulating film 11 formed on substrate 10, charge storage film 12 arranged on first insulating film 11, second insulating film 13 arranged on charge storage film 12, and control gate electrode 14 arranged on second insulating film 13.

In this embodiment, the memory transistor is explained as an N-type transistor formed on a P-type well. Alternatively, the memory transistor may be a P-type transistor formed on an N-type well. Substrate 10 will be explained as a silicon substrate. Alternatively, substrate 10 may be other semiconductors. Further, first insulating film 11, charge storage film 12, second insulating film 13, control gate electrode 14 may be laminated layers including multiple films of types different from each other.

The logic transistor has a gate structure obtained by laminating third insulating film 18 formed on substrate 10 and control gate electrode 19 arranged on third insulating film 18. The logic transistor has no charge storage film between substrate 10 and control gate electrode 19. Therefore, the distance from substrate 10 to the lower surface of control gate electrode 19 is shorter than that of the memory transistor.

In the logic transistor, the distance is usually equal to or less than 5 nm. In the memory transistor the distance is equal to or more than 10 nm. In this embodiment, the logic transistor is explained as an N-type transistor formed on a P-type well. Alternatively, the logic transistor may be a P-type transistor formed on an N-type well. Substrate 10 will be explained as a silicon substrate. Alternatively, substrate 10 may be other semiconductors. Further, third insulating film 18 and control gate electrode 19 may be laminated layers including multiple, different types of films.

A region of substrate 10 where a channel of the memory transistor is formed is doped in P-type to be a well. On the surface region of substrate (well) 10, source/drain diffusion layers 15 doped are N-type is formed. Likewise, the logic transistor also has source/drain diffusion layers 15 doped in N-type formed on the surface region of substrate (well) 10.

It should be noted that a transistor which does not have a charge storage film may be used as the memory transistor if it can capture charges inside the gate insulating film in some way. For example, a laminated film having multiple materials (films) may be used as a gate insulating film, where charges may be captured at interfaces between these multiple films. Also in this case, in order to efficiently capture charges, the memory transistor may be configured such that the distance from substrate 10 to the lower surface of control gate electrode 14 is longer than the distance from substrate 10 to the lower surface of control gate electrode 19 in the logic transistor.

When the memory transistor is in written state, a large amount of electrons are captured into the charge storage film and the threshold voltage is relatively high. On the other hand, when the memory transistor is in erased state, a small amount of electrons are captured into the charge storage film and the threshold voltage is relatively low.

FIG. 2 illustrates one cell of a programmable logic switch according to the present embodiment.

Cell 1a of the programmable logic switch according to the present embodiment includes two memory transistors M11, M21 connected in series, and logic switch circuitry 30. The gate of memory transistor M11 is connected to a word line WL1. One of the source/drain of memory transistor M11 is connected to a bit line BL1, and the other of the source/drain is connected to node Q (output line).

Gate of memory transistor M21 is connected to word line WL1. One of the source/drain of memory transistor M21 is connected to bit line BL2, and the other of the source/drain is connected to node Q. Node Q is connected to logic switch circuitry 30. Logic switch circuitry 30 controls connection states of multiple wires, based on data stored in memory transistors M11, M21. Memory transistors M11, M21 are formed in a common well, and the common well is connected to conductive line SUB1.

During operation of the programmable logic switch, one of memory transistors M11, M21 is set to written state and the other of memory transistors M11, M21 is set to erased state. An operation voltage is applied to word line WL1. The operation voltage is larger than the threshold voltage of the memory transistor in erased state but is smaller than the threshold voltage of the memory transistor in written state. A power supply voltage is applied to one of bit lines BL1, BL2, and a ground voltage is applied to the other of bit lines BL1, BL2. Accordingly, a power supply voltage or a ground voltage is applied to logic switch circuitry 30 via one of memory transistors M11, M21 in erased state.

As shown in FIG. 3A, pass transistor PT1 can be used as a simple example of logic switch circuitry 30. Pass transistor PT1 is a logic transistor without any memory function, and the gate of pass transistor PT1 is connected to node Q. Memory transistors M11, M21 and pass transistor PT1 may be formed in different wells, or may be formed in the same well (common well) as shown in FIG. 3A. In the latter case, the common well is connected to conductive line SUB21.

Figure 3B:
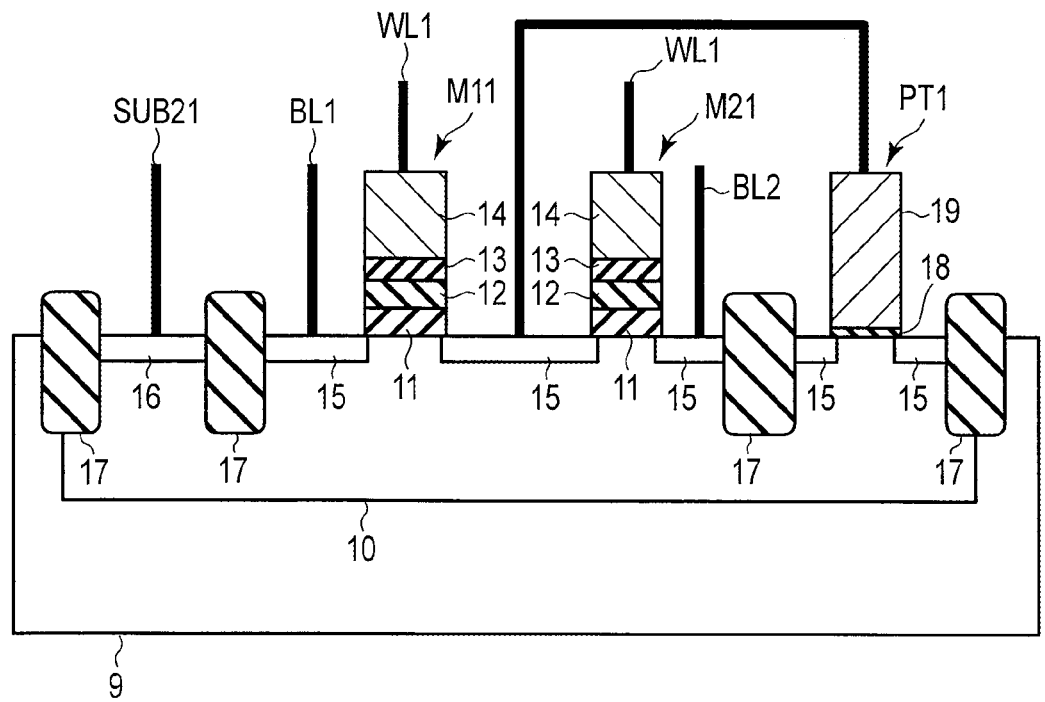

FIG. 3B illustrates an example of a cross sectional view of cell 1b.

As shown in FIG. 3B, memory transistors M11, M21 and pass transistor PT1 are made in common well 10. In this well, substrate electrode (for example, diffusion layer) 16 for applying the substrate voltage is provided.

The memory transistors M11, M21 are MONOS-type transistors having gate structure obtained by laminating silicon oxide film (first insulating film) 11 formed on a channel formation area of the silicon substrate, silicon nitride film (charge storage film) 12 arranged on the first insulating film, silicon oxide film (second insulating film) 13 arranged on the charge storage film, and control gate electrode 14 arranged on the second insulating film.

As shown in FIG. 3A and FIG. 3B, both of the gates of memory transistors M11, M21 are connected to word line WL1. One of source/drain electrodes 15 of memory transistor M11 is connected to bit line BL1, and the other of source/drain electrodes 15 of memory transistor M11 is connected to one of source/drain electrodes 15 of memory transistor M21. The other of source/drain electrodes 15 of memory transistor M21 is connected to bit line BL2. Connection node Q of memory transistors M11, M21 is connected to the gate of pass transistor PT1.

It should be noted that when the gates of both of memory transistors M11, M21 are connected to word line WL1, this means that they are electrically at the same potential. For example, as shown in FIG. 4, even if they are locally connected to separate wire (word lines WL1, WL2), all of writing method, erasing method, operation method, and the like explained later can be applied in the same way when word lines WL1, WL2 are electrically at the same potential.

In FIG. 3B, memory transistors M11, M21 are formed on the same active area enclosed by device isolation regions (for example, Shallow Trench Isolation (STI) insulating layers) 17. Alternatively, they may be formed on different active areas.

(Writing Method)

A writing method for writing memory transistors M11, M21 of cell 1b will be explained with reference to FIGS. 5 to 7. In the explanation below, a state in which relatively large amount of electrons are accumulated in the charge storage film of the memory transistor and the threshold voltage Vth is high is defined as written state. A state in which relatively small amount of electrons are accumulated in the charge storage film and the threshold voltage Vth is low is defined as erased state. In the explanation, the threshold voltage of the erased state of memory transistors M11, M21 is 2V, and the threshold voltage of the written state is 6V.

CHEs (Channel hot electrons) are used to write memory transistors M11, M21 according to the present embodiment. The CHEs, which have extremely high energy, are generated when the drain voltage of the transistor gets higher than a certain amount and the channel is pinched off at the end of the drain. The CHEs generated by the potential difference between the source and the drain are pulled into the charge storage film by the gate voltage, and writing to the memory transistor is achieved. When the writing method using the CHEs is compared with the writing method using an FN (Fowler-Nordheim) current, the writing method using the CHEs is advantageous in that the voltage applied to each terminal is low.

To write data to only memory transistor M21 when both of memory transistors M11, M21 are in erased state, a first write voltage is applied to word line WL1 and a second write voltage is applied to bit line BL2 as shown in FIG. 5A. A ground voltage is applied to bit line BL1 and the substrate electrode SUB21.

The first write voltage is set at a voltage higher than threshold voltage Vth of memory transistors M11, M21 in erased state, but less than the voltage at which the memory transistor is written with the FN current. More specifically, a voltage of about 20 V is required to write the memory transistor with the FN current. For this reason, the first write voltage is set at a voltage lower than 20 V.

The second write voltage is set at a voltage that exceeds the height of the energy barrier between the silicon and silicon oxide film 11. This is because the CHEs generated at the end of the drain of memory transistor M21 need to jump over the energy barrier of silicon oxide film (first insulating film) 11 and go into silicon nitride film (charge storage film) 12. On the other hand, the second write voltage is set at a voltage so as not to break down a pn junction between the well (P-type) of memory transistor M21 and the diffusion layer (N-type) of the source and drain.

In the present embodiment, for example, the first write voltage is set at 10V, and the second write voltage is set at 4V. However, the first write voltage and the second write voltage are not limited thereto. The first write voltage and the second write voltage may be the same voltage, or the second write voltage may be higher than the first write voltage.

FIG. 5B illustrates timing with which the first write voltage and the second write voltage are applied. In the present embodiment, as shown in FIG. 5B, the first write voltage is given to word line WL1 before the second write voltage is given to bit line BL2.

This writing method allows selective writing to memories, and can avoid gate breakdown of pass transistor PT1 caused by the write voltage. First, the principle allowing selective writing to memories will be explained.

When the first write voltage (for example, 10V) is applied to word line WL1, both of memory transistors M11, M21 are made into ON state. The first write voltage is a voltage lower than a voltage required to write with the FN current. For this reason, neither of the memory transistors M11, M21 is written by applying only the first write voltage.

Thereafter, the second write voltage (for example, 4V) is applied to bit line BL2. As a result, a difference occurs between the gate-source voltage (hereinafter referred to as drive voltage) of the memory transistor M11 and that of the memory transistor M21. The drive voltage of memory transistor M11 is 10V, and the drive voltage of memory transistor M21 is 6V. In general, the channel resistance of the transistor decreases as the drive voltage increases. More specifically, memory transistor M11 has a lower resistance than memory transistor M21 connected to bit line BL2.

In this case, the channel resistance of memory transistor M11 is defined as R1, the channel resistance of memory transistor M21 is defined as R2, the voltages applied to bit lines BL1, BL2 are defined as VBL1, VBL2, respectively, and the potential of node Q is defined as VQ. Then, VQ is expressed by the following expression.

$$VQ=(R1/(R1+R2))\times(VBL2-VBL1)$$

In this case, R1<R2 holds, and therefore, VQ is lower than (VBL2−VBL1)/2. More specifically, VQ is closer to VBL1 than VBL2. Therefore, the source-drain voltage of memory transistor M21 is higher than that of memory transistor M11.

As mentioned above, the CHEs are generated when the channel of the memory transistor is pinched off at the end of the drain. The channel is pinched off when the source-drain voltage of the memory transistor is increased and it attains a certain voltage (hereinafter referred to as VDsat). Once the pinch-off is exhibited, the drain current of the memory transistor is saturated.

Figure 6:
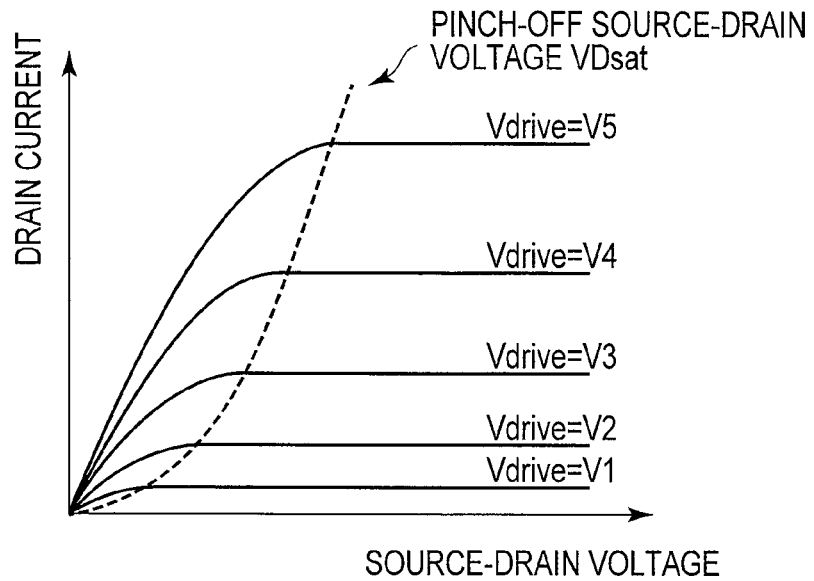
FIG. 6 is a figure illustrating relationship between a source-drain voltage and a drain current.

FIG. 6 illustrates relationship between a source-drain voltage and a drain current when five types of drive voltages (Vdrive) are applied to the memory transistor.

In FIG. 6, relationship among five types of drive voltage is as follows: V1<V2<V3<V4<V5. A broken line represents a source-drain voltage at which the channel exhibits pinch-off (VDsat). In general, as the drive voltage increases, VDsat increases.

As described above, the drive voltage of memory transistor M11 is higher than that of memory transistor M21. More specifically, the memory transistor M11 requires a higher source-drain voltage for the pinch-off than the memory transistor M21. However, the source-drain voltage of memory transistor M11 is lower than that of memory transistor M21.

Therefore, in the memory transistor M21, the channel exhibits the pinch-off and the memory is written with the CHEs. On the other hand, in the memory transistor M11, the source-drain voltage does not reach VDsat, which is required for the pinch-off, and the memory is not written with the CHEs.

Figure 7:
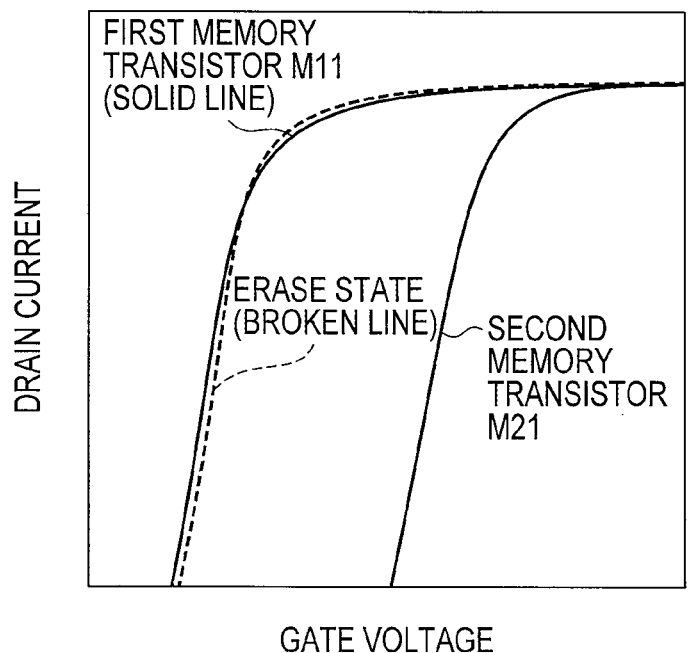
FIG. 7 is a figure illustrating relationship between a gate voltage and a drain current.

FIG. 7 is a graph showing an experimental result that the selective writing of the memory transistor is performed in a device having cell 1b of FIG. 2 using the writing method of the present embodiment.

In FIG. 7, a broken line represents characteristics of the memory transistor in erased state.

In this experiment, since two memory transistors have same device parameters, the two memory transistors show the same electrical characteristics when both of them are in erased state.

In FIG. 7, a solid line represents characteristics of the two memory transistors after the writing method as shown in FIG. 5 is performed on cell 1b including the two memory transistors in erased state. As shown in FIG. 7, when the writing method as shown in FIG. 5 is carried out, threshold voltage Vth of memory transistor M11 does not change, and only threshold voltage Vth of memory transistor M21 increases. In other words, this indicates that data have been selectively written to only memory transistor M21.

Subsequently, the principle for avoiding gate breakdown of pass transistor PT1 caused by the write voltage will be explained. In order to achieve a high-speed programmable logic switch, the film thickness of the gate insulating film of pass transistor PT1 is preferably several nanometers. In this case, the breakdown voltage of the gate insulating film is considered to be about 2 V. Therefore, when the potential of node Q increases to 2 V or more, this may cause gate breakdown of pass transistor PT1.

According to the writing method of the present embodiment, the memory transistor M11 has a higher drive voltage during writing process than memory transistor M21. Therefore, the potential VQ of the node Q is almost equal to 0 V and a stable state is established in a state that the gate of the pass transistor PT1 receives almost no voltage.

Figure 8:
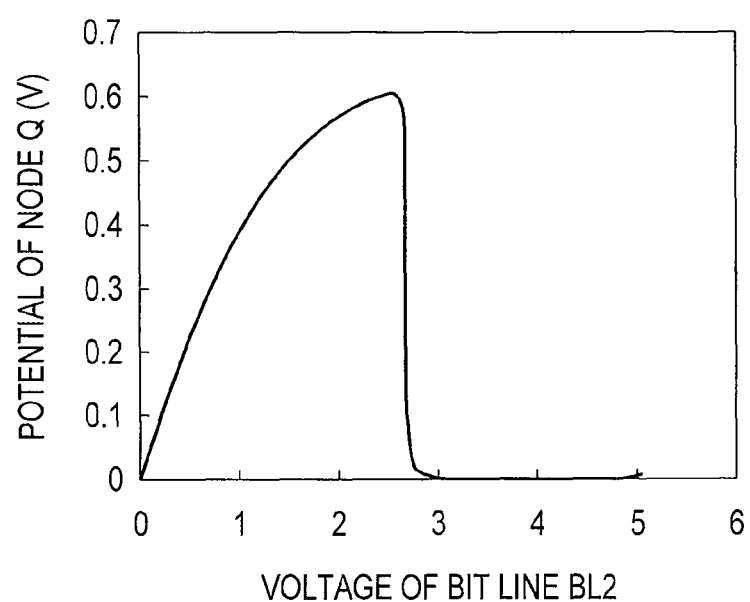
FIG. 8 is a figure illustrating relationship between a voltage of a bit line and a voltage of an output line.

FIG. 8 illustrates change of potential VQ of node Q when voltage VBL2 applied to bit line BL2 is varied while 10V is applied to word line WL1 of cell 1b as shown in FIG. 2.

When VBL2 is equal to or less than 1 V, the curve is almost linear, and the slope thereof is less than 0.5. This means that channel resistance R1 of memory transistor M11 is less than channel resistance R2 of memory transistor M21. When VBL2 increases further, VQ becomes constant at almost 0 V and remains at that level. This indicates that the memory transistor M21 exhibits pinch-off and is written with the generated CHEs, so that channel resistance R2 of memory transistor M21 significantly increases.

As described above, according to the writing method of the present embodiment, VQ can be made equal or close to 0 V, therefore a voltage which may cause breakdown in pass transistor PT1 (about 2 V) would not be applied. Therefore, the film thickness of the gate insulating film of pass transistor PT1 can be designed as a sufficiently thin thickness, which enables high-speed operation of the programmable logic switch.

As shown in FIG. 5B, the first write voltage is applied to word line WL1 before the second write voltage is applied to bit line BL2 in the present embodiment. If the second write voltage is applied to bit line BL2 while word line WL1 is 0V or in floating state, no difference is caused between channel resistance R1 of memory transistor M11 and channel resistance R2 of memory transistor M21, and VQ may become equal to or more than the breakdown voltage of the pass transistor.

Moreover, if the threshold voltages Vth of memory transistor M21 in erased state is lower than that of memory transistor M11 in erased state due to, e.g., variation in manufacturing process, memory transistor M21 has a lower resistance than memory transistor M11. At this occasion, when the second write voltage is given to bit line BL2, VQ attains a value close to VBL2, and the gate of pass transistor PT1 may be broken down.

In contrast, if the first write voltage is applied to word line WL1 in advance, memory transistors M11 and M21 always have difference in the drive voltages when a voltage is applied to bit line BL2. The difference in the drive voltages is sufficiently larger than the amount of variation of the threshold voltage of the memory transistor. Therefore, when the second write voltage is applied to bit line BL2, the potential of VQ does not attain a value close to VBL2 unexpectedly, and a voltage higher than expectation would not be applied to pass transistor PT1.

Figure 9:
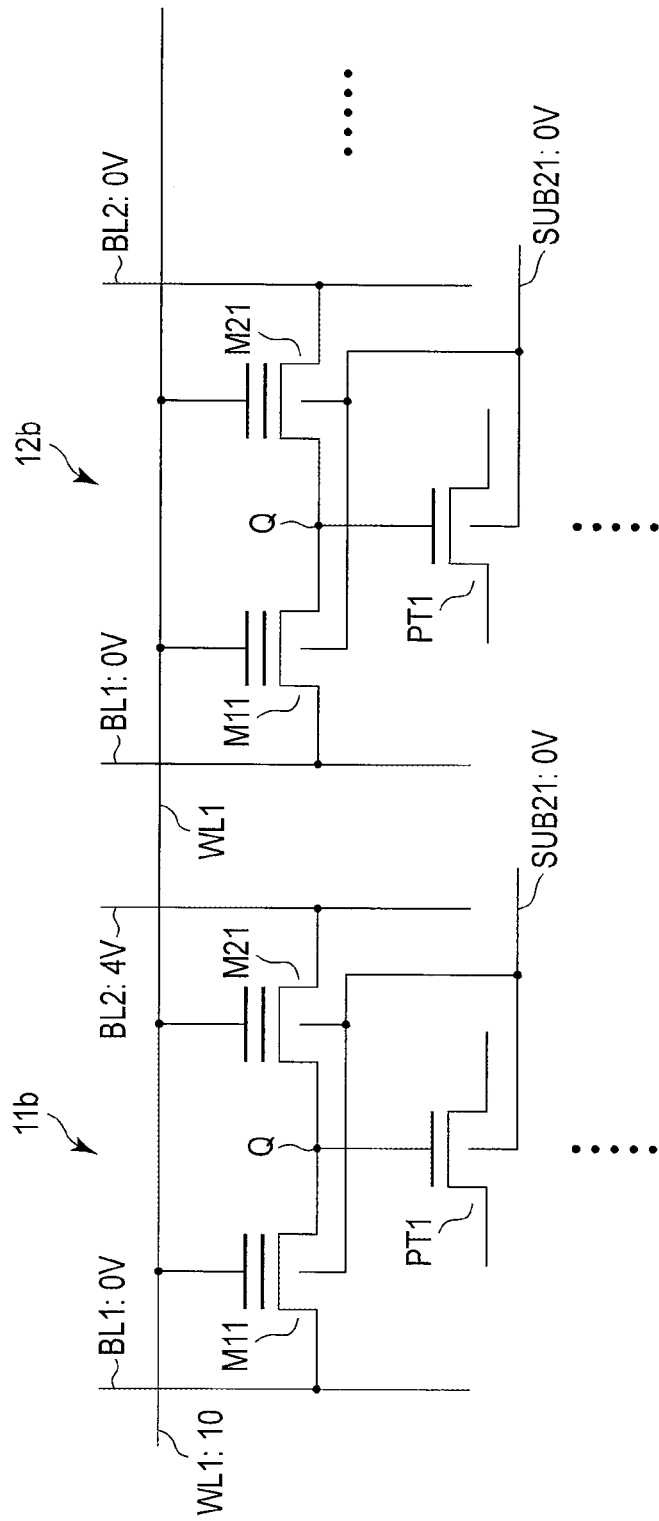

When the cells of the present embodiment are arranged in an array form, multiple cells are connected to the same word line as shown in FIG. 9. When the writing in one cell (for example, cell 11b) is conducted, writing in other cell connected to the same word line (for example, cell 12b) can be prevented by setting the potentials of bit lines BL1 and BL2 to be the same in the other cell (cell 12b). Accordingly, CHEs are not generated in the other cell (cell 12b), and false writing is not caused.

As described above, according to the present embodiment, a new device need not be added to the cell in addition to the memory device and the logic switch circuit for the purpose of selectively writing of the memory transistor and for the purpose of preventing breakdown of the gate insulating film of the pass transistor. Furthermore, the two memory transistors included in the cell are connected to common word line. Therefore, according to the present embodiment, the programmable logic switch can be achieved with the size of area of the chip being small, wherein the memory transistor can be selectively written, and a high voltage is not applied to the pass transistor when the memory is written.

As shown in FIG. 10, a cell of the present embodiment may be configured such that multiple pass transistors are connected to node Q, or the input terminal of the inverter may be connected to node Q. In any case, these pass transistors or the transistors constituting the inverter are configured such that the control gate electrode is connected to node Q.

In the above explanation, the writing method to memory transistor M21 has been explained. With the same method, the writing to memory transistor M11 can also be achieved. When memory transistor M11 is written, the second write voltage is applied to bit line BL1, and bit line BL2 is set at the ground voltage.

In the above explanation, the ground voltage is given to bit line BL1 and the substrate electrode. Alternatively, a third write voltage which has a negative polarity may be given. By setting the well potential of the memory transistor at a negative level, the electron injection efficiency is expected to be increased, and the value of the first write voltage is expected to be reduced. However, in this case, it is necessary to pay attention so that the gate insulating film of the pass transistor would not be broken down by the third write voltage given to the substrate electrode.

The potential of node Q during writing process is almost the same as VBL1, thus the difference between the third write voltage and the voltage given to BL1 needs to be lower than the breakdown voltage of the gate insulating film of the pass transistor. For example, when the third write voltage is also given to bit line BL1, the stress given to the gate insulating film of the pass transistor can be minimized. It should be noted that the voltages given to bit line BL1 and the substrate electrode may be the same or may be different.

(Erasing Method)

A method for erasing data from the memory transistor of the present embodiment will be explained with reference to FIG. 11.

To change the memory transistor into erased state, a negative erase voltage is applied to word line WL1 while a voltage 0 V is applied to the substrate electrode SUB21. Since the erasing method of the present embodiment uses the FN current, the erase voltage is, for example, −20 V. According to this erasing method, both of the memory transistors M11, M21 included in the cell are changed to erased state. Furthermore, all the memory transistors connected to the same word line in the cell array are changed to erased state. During erasing operation, the substrate potential is set at 0 V, and therefore, no damage is given to the pass transistor PT1.

When a negative erase voltage is applied to word line WL1, potential VQ of node Q may be modulated in the negative direction due to capacitive coupling between the gate and the drain of the memory transistor. However, when the potential VQ decreases to a level lower than the substrate potential, currents flow via the pn junction between the diffusion layer (N-doped) of the drain and the well (P-doped) of the memory transistor. Therefore, with this current, VQ immediately gets the same potential as the substrate potential. Therefore, a high voltage would not be applied to pass transistor PT1 by the capacitive coupling to the erase voltage.

Another method for erasing data from the memory transistor includes applying a positive erase voltage (for example, about 20 V) to the substrate electrode and giving a voltage 0 V to word line WL1. However, in the present embodiment, the well of pass transistor PT1 and memory transistors M11, M21 is the same, and accordingly when the erase voltage is given to the well of memory transistors M11, M21, the erase voltage is also applied to the well of pass transistor PT1 at the same time.

Then, the erase voltage is output from pass transistor PT1 via the pn junction between the source and the well or the drain and the well of pass transistor PT1. The source and drain of pass transistor PT1 may be connected to another logic circuit (for example, input/output of the inverter), and transistors constituting the another logic circuit is also required to be configured such that the gate insulating film has a thin film thickness for high-speed operation. When a high erase voltage which has been output from pass transistor PT1 is applied to the transistors constituting the another logic circuit, the gate insulating film may be broken down.

In contrast, when the erasing method according to the present embodiment is used, the potentials of the source and the drain of the pass transistor is not high, and the logic circuit connected to the pass transistor can be composed of high-speed transistors of which film thickness of the gate insulating film is sufficiently thin.

Figure 12:
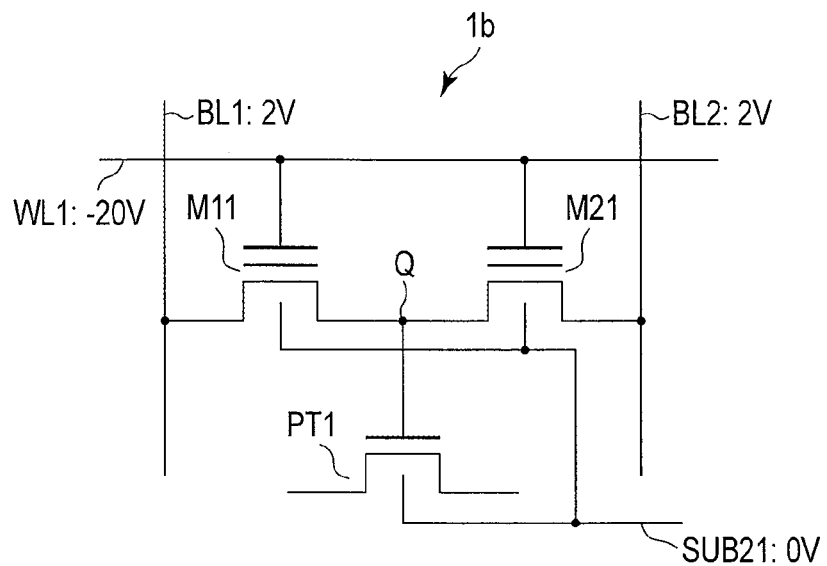

In order to enhance erase efficiency of the memory transistor, it is effective to apply a positive assist voltage to bit lines BL1 and BL2 as shown in FIG. 12. At this occasion, the assist voltage is, for example, about 2 V, and a reverse bias is applied to the pn junction between the well (P-doped) of the memory transistor and one of the source/drain diffusion layer (N-doped) of the memory transistor connected to the bit line. The larger this assist voltage is, the more greatly the erase efficiency can be enhanced, but the assist voltage should be lower than the voltage at which breakdown occurs in the pn junction.

Figure 13:
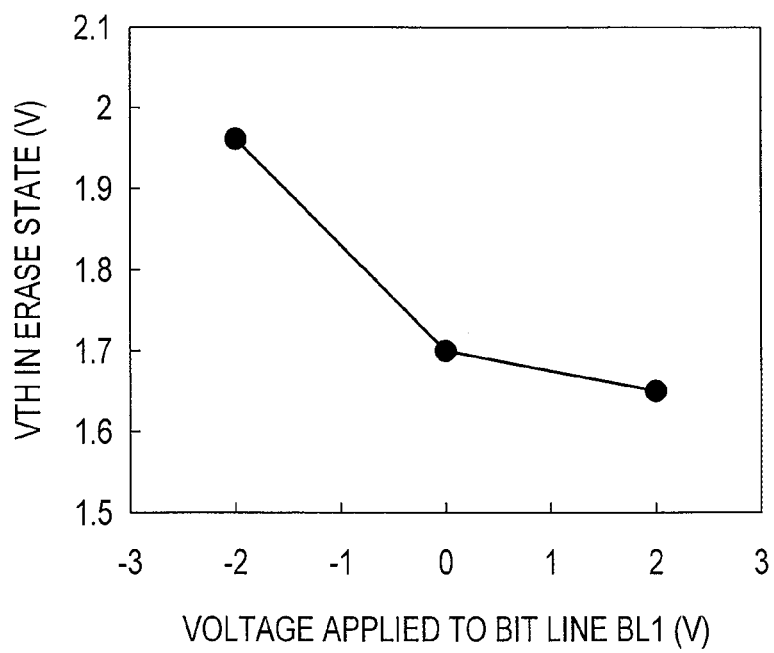
FIG. 13 is a figure illustrating relationship between a voltage of a bit line and a threshold voltage in erased state.

FIG. 13 illustrates threshold voltage Vth of the memory transistor M11 immediately after erasing operation in that various kinds of assist voltages are applied to bit line BL1 and erase voltage of −20 V is applied to word line WL1. The voltage applied to the substrate of the memory transistor M11 during erasing operation is 0 V.

In the experiment as shown in FIG. 13, the potential difference between the gate and the substrate in memory transistor M11 during erasing operation is constant. However, when a positive assist voltage is applied to bit line BL1, and the potential difference between the gate and the source in memory transistor M11 is increased, then Vth in erased state can be reduced. Therefore, to erase data of memory transistor M11 or M21 according to the present embodiment, it is effective for raising erase efficiency to apply the positive voltage to bit lines BL1, BL2.

(Operation Method)

In order to operate the programmable logic switch of the present embodiment, the first operation voltage is applied to one of bit lines BL1, BL2, the second operation voltage lower than the first operation voltage is applied to the other of bit lines BL1, BL2, and a voltage between the threshold voltage of the memory transistor in erased state and the threshold voltage of the memory transistor in written state is applied to word line WL1.

Accordingly, the memory transistor in erased state changes to ON state, and the memory transistor in written state changes to OFF state. As a result, assuming the pass transistor is an N-type transistor, the state of the pass transistor changes as follows. When the first operation voltage is applied to the gate of the pass transistor via the memory transistor in erased state, the pass transistor changes to ON state. When the second operation voltage is applied to the gate of the pass transistor via the memory transistor in erased state, the pass transistor changes to OFF state.

During the programmable logic switch operation, the voltage applied to the gate of the pass transistor should be set at a voltage higher than the voltage which is input to the source or drain of the pass transistor. Then, the signal passing through the pass transistor swings to the maximum, and accordingly, the power consumption is reduced, and the delay is reduced. More specifically, the voltage applied to the gate of the pass transistor in ON state should be set at a voltage more than a summation of the voltage of the signal which is input into the source or drain of the pass transistor and the threshold voltage of the pass transistor.

The first operation voltage is given to the gate of the pass transistor in ON state via the memory transistor in erased state. When the transistors constituting the memory transistor are N-type transistors, the voltage given to the gate of the memory transistor should be set as follows. In order to give the first operation voltage to the gate of the pass transistor, the voltage given to the gate of the memory transistor should be set at a voltage more than a summation of the first operation voltage and the threshold voltage of the memory transistor in erased state.

More specifically, a higher level of the signal passing through the pass transistor is defined as Vdh, a lower level of the signal passing through the pass transistor is defined as Vdl, the threshold voltage of the pass transistor is defined as Vthpt, the threshold voltage of the N-type memory transistor in erased state is defined as Vthm, the voltage applied to word line WL1 is defined as Vwl, the first operation voltage is defined as V1, and the second operation voltage is defined as V2. Then, in order to pass the first and second operation voltages via the memory transistor, it is necessary to satisfy the following expressions.

$$Vwl>Vthm+V1$$

$$Vwl>Vthm+V2$$

Since the first operation voltage is more than the second operation voltage, the following expressions should be satisfied.

$$Vwl>Vthm+V1$$

The following expressions are to hold based on a condition where the passing signal swings to the maximum when the pass transistor is in ON state and based on a condition for not passing the signal when the pass transistor is in OFF state.

$$V1>Vdh+Vthpt$$

$$V2<Vdl+Vthpt$$

In addition, the following relationship is also derived from these expressions.

$$Vwl>Vthm+Vdh+Vthpt$$

When each voltage is set at a value satisfying the above relationships, the power consumption is not increased, and delay can be suppressed. Even when the pass transistor is the P-type transistor, the above expressions hold with Vthpt being a negative value.

(Requirement of Gate Length)

The MONOS-type memory transistors have the same structure except the gate insulating film as the logic transistor including the pass transistor, and can be manufactured by similar methods. For this reason, when the MONOS-type memory transistor is employed, a chip having memory transistors and logic transistors in proximity in a mixed manner can be achieved at a low cost.

However, the memory transistor and the logic transistor require different performances, and therefore, it is not desirable to manufacture the memory transistors and logic transistors using completely the same process conditions (except those concerning the gate insulating films).

More specifically, in the memory transistor, a difference between threshold voltage Vth in written state and that in erased state (hereinafter this will be referred to as Vth window) needs to be large, and reliability such as long-time data retention is important.

Such performances, however, is not required of the logic transistor. On the other hand, the ratio of the size of area occupied by the logic transistor in the chip is larger than that of the memory transistor, and therefore, reduction of the size of the logic transistor gives great impact on reduction of chip size. Therefore, the gate length of the logic transistor is preferably reduced to the minimum feature size or a size almost close to the minimum feature size. However, the ratio of the size of area occupied by the memory transistor in the chip is not so large, and therefore, the gate length of the memory transistor is allowed to have a relatively large value.

According to the above, the programmable logic switch of the present embodiment is preferably configured such that the gate length of the memory transistor is longer than that of the logic transistor including the pass transistor. In general, the film thickness of the gate insulating film of the memory transistor is about 10 times of that of the logic transistor, and therefore, if the memory transistor is made such that the gate length is of the same size as that of the logic transistor, the controllability of the gate is deteriorated, which may increase an OFF leakage current in the memory transistor. This may increase the power consumption during the programmable logic switch operation.

The ratio of the size of area occupied by the memory transistor in the chip is small than that by the logic transistor, and therefore, the increase in gate length of the memory transistor gives small impact on increase of the chip size. Therefore, by making the gate length of the memory transistor larger than that of the logic transistor, the programmable logic switch can be achieved of which power consumption is suppressed and of which the chip size is small.

(Requirement of Source/Drain Diffusion Layer)

In the programmable logic switch of the present embodiment, the source/drain diffusion layer is preferably made deeply in the memory transistor, and it is preferably made shallowly in the logic transistor. The details thereof will be explained.

As shown in FIG. 14A, the source and drain of the N-type transistor is made by injecting donor ions into semiconductor substrate (P-type well) 10 using the gate electrode and the like as a mask and forming diffusion layers 15a. In general, diffusion layer 15a includes region 151a where impurities are spread to a small extent and the concentration thereof is relatively low and region 152a where impurities are spread to a large extent and the concentration thereof is relatively high. In particular, region 151a is called S/D extension region.

As shown in FIG. 14B, a method for injecting acceptor ions so as to cover S/D extension regions 151a and forming regions 15b of which channel impurity concentration is locally high in proximity to the source and drain is often used. Region 15b is called a halo region. The halo ion implantation is effective to suppress the OFF leakage current in a transistor of which gate length is short.

FIGS. 15 to 19 illustrate an example of a method for manufacturing source/drain diffusion layers.

First, as shown in FIG. 15, gate electrode 14 of the transistor and insulating films 11, 12, 13 immediately below gate electrode 14 are processed, and thereafter, as shown in FIG. 16, spacers 21 made of insulating films are formed on the side surface of gate structures 11 to 14.

As an example, spacers 21 shown in FIG. 16 are formed only on the side surfaces of the gate structure. They are made by depositing an insulating material on the entire surface of the wafer and removing the insulating material from a flat area by dry etching. However, if the injection energy of subsequent S/D extension implantation is sufficiently high, the dry etching after depositing an insulating materials may not be performed, and the materials themselves may be employed as spacers 21. Examples of spacer materials include $SiO_2$, SiN, and laminated films thereof.

Subsequently, as shown in FIG. 17, ion implantation is performed to form S/D extension regions 151a using gate electrode 14 and spacers 21 as a mask. When the gate length of the transistor is short and it is necessary to suppress the OFF leakage current, the ion implantation may be performed continuously for forming halo regions 15b.

The impurities injected into substrate (well) 10 by the ion implantation are diffused in each of a direction perpendicular to substrate 10 and a direction parallel to substrate 10 during a subsequent thermal treatment. Therefore, as shown in FIG. 17, a part of S/D extension region 151a exists beneath gate electrode 14.

Hereinafter, as shown in FIG. 20, the size, in a direction parallel to the channel, of a region in which extension 151a and gate electrode 14 overlaps each other when seen from the upper surface of substrate 10 is defined as a gate-extension overlap.

When the gate-extension overlap becomes 0 or less, a region that cannot be controlled by the gate voltage exists between the source and the drain, which increases the parasitic resistance. However, when the gate-extension overlap is too large, the diffusion layers of the source and the drain come into contact with each other in a device having a short gate length, which significantly increases the OFF leakage current.

The size of the gate-extension overlap can be controlled by the film thickness of spacer 21. If a large gate-extension overlap does not matter, it may not be necessary to form spacer 21.

The size of the gate-extension overlap depends on not only the film thickness of spacer 21 but also the impurity concentration of the halo region. When the halo ion implantation is performed with high dose, region 15b includes many impurities whose polarity is opposite to that of the impurities of S/D extension region. Then, the effect of the impurities by S/D extension ion implantation is cancelled by that by the halo ion implantation.

Therefore, even if the S/D extension implantation is performed under the same condition, the gate-extension overlap is smaller in a device having a higher impurity concentration in halo region.

Subsequently, as shown in FIG. 18, in order to form deep S/D region, gate sidewalls 22 are formed. Thereafter, as shown in FIG. 19, ion implantation is performed using gate electrode 14, spacers 21, gate sidewalls 22 as a mask so as to form deep S/D regions 152a.

In this example, deep S/D regions 152a are formed after S/D extension regions 151a are formed. Alternatively, S/D extension regions 151a may be formed after deep S/D regions 152a are formed.

In this example, the N-type memory transistor is shown. However, the same processes are also applicable to the logic transistor. In a case of a P-type transistor, the same effects can also be obtained by forming P-type doped diffusion layer 15a and forming N-type doped halo regions 15b.

In a case of a logic transistor, the gate-extension overlap should not be equal to or less than 0, but is preferably smaller as much as possible. This is because, when the gate-extension overlap is large, the OFF leakage current increases in a transistor having a short gate length, and moreover, the parasitic capacitance between the gate and the source or the gate and the drain also increases.

On the other hand, in a case of a memory transistor, when the gate-extension overlap is small, the erase characteristics of the memory are deteriorated.

FIG. 21 is a comparison of Vth windows between a device on which ion implantation to form S/D extension regions is performed without providing any spacer and a device on which ion implantation to form S/D extension regions has been performed after making spacers having a film thickness of 10 nm.

Vth window decreases in the memory transistor having the spacers, and it is understood that the memory characteristics are deteriorated.

Further, when the impurity concentration of the halo region is increased, as described above, the effect of the impurities in the S/D extension regions is cancelled by the impurities having a polarity opposite to the S/D extension regions, and the gate-extension overlap further decreases. Accordingly, Vth window further decreases.

The reason why Vth window decreases due to the decrease of the gate-extension overlap is considered to be because the amount of electrons passing from the charge storage film to the source/drain diffusion layer decreases when the memory is erased.

According to the above, in the logic transistor such as the pass transistor, the gate-extension overlap is preferably smaller, but in the memory transistor, the gate-extension overlap needs to be somewhat larger in order to improve the erase characteristics. More specifically, the gate-extension overlap in the memory transistor is preferably larger than that in the logic transistor.

It should be noted that, in this specification, the gate-extension overlap is supposed to be the one after thermal activation. The size of the gate-extension overlap can be found by measuring the impurity concentration in the substrate using analysis by Scanning Spread Resistance Microscope (SSRM) and the like.

The boundary of the S/D extension region is defined, for example, in the manner described below.

In the definition below, Na is the concentration of acceptor ions in the substrate, and Nd is the concentration of donor ions in the substrate.

In the Case of an N-type Transistor

Na is greater than Nd in the channel region of the N-type transistor, and Nd is greater than Na in the S/D extension region of the N-type transistor. Therefore, the boundary of the S/D extension region can be defined as a portion where Na and Nd are equal to each other.

In the Case of a P-type Transistor

Nd is greater than Na in the channel region of the P-type transistor, and Na is greater than Nd in the S/D extension region of the P-type transistor. In this case as well, the boundary of the S/D extension region can be defined as a portion where Na and Nd are equal to each other.

There is variation in the size of the S/D extension region. The reasons for this include variation in the ion implantation energy, variation in processing of the spacer, variation in heat distribution within the chip during activation, and the like. Among them, what has great impact is considered to be the variation in processing of the spacer, and the variation in the thickness of the spacer should be suppressed within 10% of total thickness of the spacer.

In general, the spacer with a thickness of 10 nm is usually employed, and therefore the variation in the size of the S/D extension region is considered to be about 1 nm. Therefore, if the gate-extension overlap in the memory transistor is larger than that in the logic transistor by 1 nm or more, this is considered to be significant difference.

The gate-extension overlap in the memory transistor is preferably larger than that in the logic transistor, and therefore, if the formation of the source-drain diffusion layers of the memory transistor and the logic transistor are done at the same time, the characteristics of any one of the memory transistor and the logic transistor are deteriorated.

Accordingly, hereinafter, the first to third examples will be explained concerning the method for achieving a memory transistor which has excellent memory characteristics and a logic transistor in which the OFF current is well suppressed even with a short gate length.

FIGS. 22 to 25 illustrate the first example for forming the S/D extension regions.

First, as shown in FIG. 22, the gate electrodes 14, 19 of the transistor and the insulating films 11, 12, 13, 18 immediately under the gate electrodes 14, 19 are processed, and thereafter, as shown in FIG. 23, the spacers 21 are formed in both of the memory transistor region and the logic transistor region at a time. In this example, the spacers 21 are formed only on the side surfaces of the gate structure, but the insulating film deposited on the entire surface of the chip may be used as the spacer, or the spacer 21 may not be provided.

Subsequently, as shown in FIG. 24, ion implantation is performed while the memory transistor region is masked by a resist 23, and the halo regions 15b and the S/D extension regions 151a are formed in the logic transistor region. Thereafter, the resist 23 is removed.

Subsequently, as shown in FIG. 25, ion implantation is performed while, this time, the logic transistor region is masked by a resist 23, and the halo regions 15b and the S/D extension regions 151a are formed in the memory transistor region. Thereafter, the resist 23 is removed.

It should be noted that the steps of forming the halo regions and the S/D extension regions in the logic transistor and the steps of forming the halo regions and the S/D extension regions in the memory transistor may be performed in the opposite order. Alternatively, the halo regions 15b may not be formed.

In this first example, in order to make the gate-extension overlap in the memory transistor larger than that in the logic transistor, the following methods may be possible.

For example, the S/D extension implantation in the memory transistor may be performed with a higher level of energy than the S/D extension implantation in the logic transistor. Alternatively, the S/D extension implantation of the memory transistor may be performed with higher dose than the S/D extension implantation of the logic transistor. Further, the S/D extension implantation of the memory transistor may be performed using phosphorus ions and the S/D extension implantation of the logic transistor may be performed using arsenic ions.

As shown in FIG. 35, when an angle between an ion injection direction and a line normal to the substrate surface is defined as a tilt angle $\theta$, the S/D extension implantation of the memory transistor may be performed using a tilt angle larger than that of the S/D extension implantation of the logic transistor.

Further, the halo ion implantation in the logic transistor may be performed with higher dose than that in the memory transistor, so that the effective size of the gate-extension overlap is reduced in the logic transistor.

FIGS. 26 to 29 illustrate the second example for forming S/D extension regions.

First, as shown in FIG. 26, the gate electrodes 14, 19 of the transistor and the insulating films 11, 12, 13, 18 immediately under the gate electrodes 14, 19 are processed, and thereafter, as shown in FIG. 27, the spacers 21 are formed in both of the memory transistor region and the logic transistor region at a time. In this example, the spacers 21 are formed only on the side surfaces of the gate structure, but the insulating film deposited on the entire surface of the chip may be used as the spacer.

Subsequently, as shown in FIG. 28, the logic transistor region is masked by a resist 23, and a part or all of the spacer 21 of the memory transistor is removed by wet etching. More specifically, the width of the spacer 21 in the memory transistor in the direction perpendicular to the side surface of the gate is shrunk by this etching. Thereafter, the resist 23 is removed.

Subsequently, as shown in FIG. 29, ion implantation is performed, and halo regions 15b and extension region 151a are formed in the memory transistor regions and the logic transistor region at a time. Alternatively, the halo region 15b may not be formed.

In contrast to the first example, the second example is advantageous in that the number of lithography process is small, and the manufacturing cost can be reduced to a low level. By adjusting the amount of etching of the spacer 21 in FIG. 28, the difference between the size of the gate-extension overlap in the memory transistor and that in the logic transistor can be correctly controlled.

FIGS. 30 to 34 illustrate the third example for forming the S/D extension regions.

First, as shown in FIG. 30, the gate electrodes 14, 19 of the transistor and the insulating films 11, 12, 13, 18 immediately under the gate electrodes 14, 19 are processed, and thereafter, as shown in FIG. 23, the spacers 21 are formed in both of the memory transistor region and the logic transistor region at a time. In this example, the spacers 21 are formed only on the side surfaces of the gate structure, but the insulating film deposited on the entire surface of the chip may be used as the spacer, or the spacer 21 may not be provided.

Subsequently, as shown in FIG. 32, ion implantation is performed on the memory transistor region and the logic transistor region, and halo regions 15b are formed. However, if it is not necessary to perform the halo ion implantation on the memory transistor region, this step is unnecessary.

Subsequently, as shown in FIG. 33, the memory transistor region is masked with the resist 23, and additional halo ion implantation is performed on the logic transistor region. Accordingly, the halo impurity concentration of the logic transistor is higher than that of the memory transistor. Thereafter, the resist 23 is removed.

Subsequently, as shown in FIG. 34, S/D extension implantation is performed, and diffusion regions 151a are formed in the memory transistor region and the logic transistor region at a time. At this occasion, the halo impurity concentration in the logic transistor region is high, and therefore the gate-extension overlap in the logic transistor is smaller than that of the memory transistor.

In this example, after the halo ion implantation is performed, the extension implantation is performed, but the halo ion implantation may be performed after the extension implantation is performed.

As described above, like the second example, the third example is also advantageous in that the number of lithography process is smaller than the first example, and the manufacturing cost can be reduced to a low level.

(Requirement of Charge Storage Film)

When an MONOS-type transistor is used as the memory transistor in the present embodiment, it is preferable that injected charge is distributed with a low degree of unevenness in the charge storage film 12 in order to change the threshold voltage by a sufficient amount as explained later.

In the silicon nitride (SiN) used for forming the charge storage film 12 in the present embodiment, the trap levels of charges vary according to the rates of contents of Si and N. The molar ratio of N with respect to the molar ratio of Si in SiN is defined as N/Si ratio. Since Si atom has four unpaired electrons, and N atom has three unpaired electrons, a stoichiometric composition ratio between Si and N is N/Si=1.33 (hereinafter, SiN film having N/Si ratio of 1.33 is referred to as stoichiometric SiN film). In contrast, in the SiN film of which N/Si ratio is less than that of the stoichiometric SiN film (hereinafter referred to as Si-rich SiN film), the trap level of electrons become shallower than that in the stoichiometric SiN film, and the electrons in the film are more likely to be movable.

When the stoichiometric SiN film is used as the charge storage film 12, the electrons injected into the charge storage film 12 by writing are trapped locally in the film. When writing, CHEs are generated at the end of the drain of the memory transistor. For this reason, the electrons trapped within the charge storage film by CHE writing are trapped in such a manner that they are concentrated at the side of the drain, and the potential distribution within the channel of the memory transistor becomes asymmetric.

In the N channel transistor, where one of source/drain diffusion regions in which potential is higher is defined as "drain", and the other of source/drain diffusion regions in which potential is lower is defined as "source", the channel resistance of the transistor is greatly dependent upon the potential barrier at the side of the source.

For example, the same amounts of electrons are injected into the charge storage films of two memory transistors. In one of the memory transistors, more electrons are accumulated at the side of the drain in the charge storage film. In the other of the memory transistors, more electrons are accumulated at the side of the source in the charge storage film. In this case, the memory transistor in which more electrons are accumulated at the side of the source in the charge storage film can modulate the potential of the source more strongly, which makes larger change in threshold voltage Vth (See, for example, IEEE ELECTRON DEVICE LETTERS, vol. 21, pp. 543-545, 2000).

Therefore, when the electrons injected to the charge storage film by CHE writing are trapped locally in proximity to the drain, threshold voltage Vth may not change sufficiently depending on the application direction of the source-drain voltage.

When threshold voltage Vth does not change sufficiently, a problem would be caused when the programmable logic switch is operated.

An example will be explained where the programmable logic switch is operated by applying a voltage to each conductive line of cell 1b in the manner shown in FIG. 36. It is assumed that memory transistor M11 is in erased state, and memory transistor M21 is in written state.

At this occasion, 0 V is applied to the gate of the pass transistor via memory transistor M11. Under this operation condition, one of the source/drain diffusion regions of memory transistor M21 connected to node Q corresponds to "source", and the other of the source/drain diffusion regions of memory transistor M21 connected to bit line BL2 corresponds to "drain".

When the electrons injected with the CHEs exist locally at the side of the drain in the charge storage film, threshold voltage Vth of memory transistor M21 does not increase sufficiently. Accordingly, a large channel leakage current may be generated in memory transistor M21, and the power consumption may increase. Alternatively, the memory transistor M21 cannot shut off the voltage applied to bit line BL2, and the programmable logic switch may malfunction.

As described above, it is desirable that electrons exist also at the side of the source in the charge storage film when the memory transistor is written. However, when the stoichiometric SiN film is used as the charge storage film, it is necessary to have a long writing time in order to distribute the injected electrons to the side of the source in the charge storage film.

In contrast, when the charge storage film 12 is made as the Si-rich SiN film, the Si-rich SiN film has a shallower trap level than the stoichiometric SiN film, and therefore, electrons are more likely to move within the film. Therefore, the electrons injected to the end of the drain by writing move within the charge storage film 12, and spread to the side of the source.

Therefore, when the programmable logic switch is operated by applying a voltage to each conductive line of cell 1b as shown in FIG. 36, threshold voltage Vth of the memory transistor M21 in written state can be maintained at a high level, which can reduce the leakage current and can prevent malfunction of the programmable logic switch. At this occasion, it is not necessary to have a long writing time, unlike the use of the charge storage film of the stoichiometric SiN film.

The smaller the N/Si ratio is, the more likely the electrons in the charge storage film can move. However, when the N/Si ratio attains 0.67, two of four bonds of a Si atom are dangling bonds in average, or correspond to a composition forming covalent bonds with adjacent Si atoms. In this case, there are many covalent bonds, and this deteriorates the insulating property of the SiN film, which significantly increases the gate leakage current.

Therefore, the N/Si ratio is preferably more than 0.67 but less than 1.33. The composition of the charge storage film can be found through analysis based on Electron Energy-Loss Spectroscopy (EELS).

Since the Si-rich SiN film has a shallower trap level, the following phenomena are likely to occur: the trapped electrons pass to the substrate via first insulating film 11 with the energy obtained by heat and the like, or pass to control gate electrode 14 via second insulating film 13. This means that the data retention time in the memory transistor is reduced. Since the probability that electrons pass to the side of the substrate is higher than the probability that electrons pass to the side of control gate electrode 14, it is necessary to prevent the electrons in charge storage film 12 from passing to the side of the substrate in order to improve the data retention time in the memory transistor.

Accordingly, it is desirable that the N/Si ratio in the charge storage film 12 is changed in the film in the laminating direction. More specifically, in the charge storage film 12 in proximity to the interference with first insulating film 11, the N/Si ratio is set to be large in order not to deteriorate the retention characteristics, and in the charge storage film 12 in proximity to the interface with second insulating film 13, the N/Si ratio is set to be small so as to facilitate the movement of the charges within the film.

Accordingly, the variation of threshold voltage Vth caused by writing may be increased, and moreover, the data retention time in the memory can be increased.

It should be noted that in a memory transistor used for a file memory, increase of the N/Si ratio in the charge storage film in proximity to the interface with the first insulating film is not permitted because it may increase the erasing time. However, in memory transistor used in the programmable logic switch of the present embodiment, the frequency of rewriting is absolutely less than that in the memory transistor in the file memory, and the increase of the erasing time would not be serious problem. Thus there is great advantage in increase the N/Si ratio of charge storage film 12 in proximity to the interface with first insulating film 11.

In the explanation about this example, the silicon nitride film is used as the charge storage film. However, even when a silicon oxynitride film is used, localization of electrons within the charge storage film can be prevented by using a Si-rich silicon oxynitride film.

(Requirement of Block Film)

When the MONOS-type transistor is used as the memory transistor in the present embodiment, the block film of the memory transistor (corresponding to second insulating film 13) is preferably made of such a material or has such a film structure that is less likely to pass any charge. Since charge storage film 12 in a typical flash memory exchanges charges with a substrate, it is not preferable to exchange charges with the other areas (such as control gate electrode 14).

When the MONOS-type transistor is applied to the programmable logic switch like the present embodiment, a problem would be caused by injection or emission of charges from/into control gate electrode 14 into/from charge storage film 12 (hereinafter this phenomenon will be referred to as back tunneling).

For example, when SiN is used as the charge storage film, and only Si-based material such as silicon oxide (SiO2) and SiN is used as a block film, some electrons move from the control gate electrode to the charge storage film by the back tunneling during erasing operation, and this prevents decrease of threshold voltage Vth. For this reason, threshold voltage Vth of the memory transistor in erased state is generally larger than 0 V.

When the programmable logic switch is operated, the voltage applied to the control gate electrode of the memory transistor (read voltage: Vread) should be set at a level higher than threshold voltage Vth in erased state. In other words, in this case, it is necessary to apply a positive read voltage to the control gate electrode. This read voltage is typically about 4 V.

When the programmable logic switch is to operate, it is necessary to apply the read voltage to the memory transistor at all times. When the positive read voltage is applied to the memory transistor at all times, erroneous writing to the memory transistor in erased state is caused, and the programmable logic switch may malfunction.

In general, when the nonvolatile memory is used as the file memory, the read voltage is not applied to the nonvolatile memory in retention state. However, when the nonvolatile memory is used to the programmable logic switch like the present embodiment, it is necessary to guarantee long-term reliability of the nonvolatile memory while the read voltage is applied at all times.

At this occasion, by using a block film that is less likely to pass charges in the memory transistor, the back tunneling can be suppressed, and the long-term reliability of the programmable logic switch can be guaranteed.

The first example of block film 13 that is less likely to pass charges is a block film constituted by an insulating material of which dielectric constant with respect to vacuum is higher than that of SiN (7.0). This insulating material is, for example, aluminum oxide and hafnium oxide. The higher the dielectric constant of the block film is, the larger the capacitive coupling between the control gate electrode and the substrate is.

Therefore, even if the physical film thickness of block film 13 is large, the electric field applied between the control gate electrode and the substrate can be held at a high level. When the physical film thickness of block film 13 is increased, the efficiency of exchange of charges between control gate electrode 14 and charge storage film 12 is decreased. Therefore, this can prevent the back tunneling during writing and erasing to/from the memory transistor.

By preventing the back tunneling as described above, threshold voltage Vth in erased state of the memory transistor can be reduced to a negative value. Accordingly, the read voltage applied to control gate electrode 14 of the memory transistor during the operation of the programmable logic switch can be set at 0 V. More specifically, this can prevent change of the state of the memory transistor due to constant application of the read voltage other than 0 V during the programmable logic switch operation. Further, since the read voltage can be set at 0 V, and therefore, it is not necessary to provide any power supply dedicated for the read voltage.

By the way, the threshold voltage, for example, can be obtained as follows. A voltage of 50 mV is applied between the source and the drain of the transistor, and while the gate voltage is changed, the current IDS between the source and the drain is measured. When the channel width of the transistor is defined as W, and the channel length is defined as L, the gate voltage at which IDS*L/W is equal to 10 nA is defined as a threshold voltage.

It should be noted that not only the above block film 13 is used but also a metallic material of which work function is larger than that of the high-concentration N-doped polysilicon (4.05 eV) is used as control gate electrode 14 of the memory transistor. For example, tantalum, tungsten, and titanium nitride can be used. When the work function of control gate electrode 14 is larger, the electron barrier of block film 13 seen from control gate electrode 14 becomes higher. Therefore, this can prevent the back tunneling in the memory transistor during erasing operation.

FIG. 37 illustrates the second example of the block film that is less likely to pass charges.

Block film 13a of this memory transistor includes insulating film 131a provided on charge storage film 12 and insulating film 132a provided on insulating film 131a. Control gate electrode 14 formed on insulating film 132a is high-concentration N-doped polysilicon. When polysilicon is used as control gate electrode 14, this can enhance compatibility with conventional transistor manufacturing process, and can reduce the manufacturing cost.

Insulating film 131a is an insulating material having a dielectric constant higher than SiN, and examples of insulating films 131a include aluminum oxide and hafnium oxide. Insulating film 132a is SiN. When a high-dielectric constant material is used in insulating film 131a, the physical film thickness of insulating film 131a can be increased while maintaining the magnitude of the electric field between the control gate electrode and the substrate. Therefore, insulating film 131a can be made thick to prevent back tunneling. Further, insulating film 132a made of SiN is provided on insulating film 131a, and therefore, the electric field in the vicinity of the interface between the insulating film 132a and the control gate electrode 14 during erasing is weakened, thereby further suppressing the back tunneling.

FIG. 38 illustrates the third example of the block film that is less likely to pass charges.

Block film 13b of the memory transistor of this example includes insulating film 131b provided on charge storage film 12, insulating film 132b provided on insulating film 131b, and insulating film 133b provided on insulating film 132b. The control gate electrode formed on insulating film 133b is high-concentration N-doped polysilicon. Insulating film 131b is SiO2. Insulating film 132b is an insulating material having a dielectric constant higher than SiN, and examples of insulating films 132b include aluminum oxide and hafnium oxide. Insulating film 133b is SiN. Further, the film thickness of insulating film 132b is equal to or less than 1 nm.

The object of inserting insulating film 132b between insulating film 131b and insulating film 133b is to generate electrical dipoles from the high dielectric material between insulating film 131b and insulating film 133b, and to enhance the barrier of insulating film 131b at the interface between insulating film 131b and insulating film 132b. This suppresses the back tunneling from control gate electrode 14 to charge storage film 12 during erasing operation (See, for example, K. Kita, "Intrinsic origin of electric dipoles formed at high-k/ SiO$_2$ interface", IEEE International Electron Devices Meeting 2008). Further, insulating film 133b is provided on insulating film 132b, and therefore, the electric field in the vicinity of the interface between the insulating film 133b and the control gate electrode 14 during erasing operation is weakened, thereby further suppressing the effect of the back tunneling.

When insulating film 132b is inserted between insulating film 131b and insulating film 133b like the present embodiment, the film thickness of insulating film 132b can be reduced. Since the film thickness of insulating film 132b is reduced to an extremely thin thickness, hardly any change is required to be made from a conventional manufacturing process of memory transistors that are made of only Si-based material. Further, insulating film 131b made of SiO2 is provided between charge storage film 12 and insulating film 132b made of high dielectric material, and this can prevent deterioration of memory characteristics caused by diffusion of the high dielectric material into the charge storage film 12.

[Second Embodiment]

In a programmable logic switch of the second embodiment, channel width W1 of one of memory transistors included in a cell is larger than channel width W2 of the other of the memory transistors included in the cell. A circuit diagram of the cell according to the present embodiment is the same as FIG. 2. A bit line connected to the memory transistor having channel width W1 is connected to a ground potential during operation, and a bit line connected to the memory transistor having channel width W2 is connected to a power supply potential during operation.

In the explanation about this case, memory transistor M11 connected to bit line BL1 has a larger channel width than that of memory transistor M21 connected to bit line BL2. In this programmable logic switch, during operation, bit line BL1 is connected to the ground potential, and bit line BL2 is connected to the power supply potential.

In order to prevent malfunction of a pass transistor during programmable logic switch operation, the potential of node Q is required to be fixed at the ground potential or the power supply potential. For example, when a signal which is input into the source or the drain of the pass transistor changes from high level (H) to low level (L), or from L to H, the potential of node Q fluctuates due to the capacitive coupling between the source/drain and the gate.

In normal circumstances, even when the potential of node Q fluctuates, currents flow through one of memory transistor M11 and memory transistor M21 which is in erased state, so that the potential of node Q returns back to the ground potential or the power supply potential. The time that is required for the potential of node Q to return back depends on the amount of current flowing through the memory transistor, and therefore, the channel width of the memory transistor is preferably larger. However, when the channel width is increased, the chip size also increases.

How the cell 1b operates when the potential of node Q fluctuates will be hereinafter considered in following four situations. In the explanation about this situation, the ground voltage is applied to bit line BL1, the power supply voltage is applied to bit line BL2.

FIG. 39A illustrates a first situation.

In the first situation, memory transistor M11 is in written state and memory transistor M21 is in erased state, and the input signal to pass transistor PT1 changes from L to H. When the input signal into pass transistor PT1 changes from L to H, the potential of node Q fluctuates and increases. However, at this occasion, pass transistor PT1 is in ON state, and therefore, even if the potential of node Q fluctuates to increase, the ON/OFF states of the pass transistor does not change.

FIG. 39B illustrates a second situation.

In the second situation, memory transistor M11 is in written state and memory transistor M21 is in erased state, and the input signal to pass transistor PT1 changes from H to L. When the input signal into pass transistor PT1 changes from H to L, the potential of node Q fluctuates and decreases. At this occasion, the pass transistor is in ON state, but the potential of node Q decreases, so that it may be in OFF state for a moment.

However, the signal which is to be passed by pass transistor PT1 at this moment is L. Even if pass transistor PT1 is in OFF state for a moment and is unable to pass L, the state in which the signal cannot be passed may be considered to be equivalent to L, and therefore, this does not cause the programmable logic switch to malfunction.

Figure 39C:
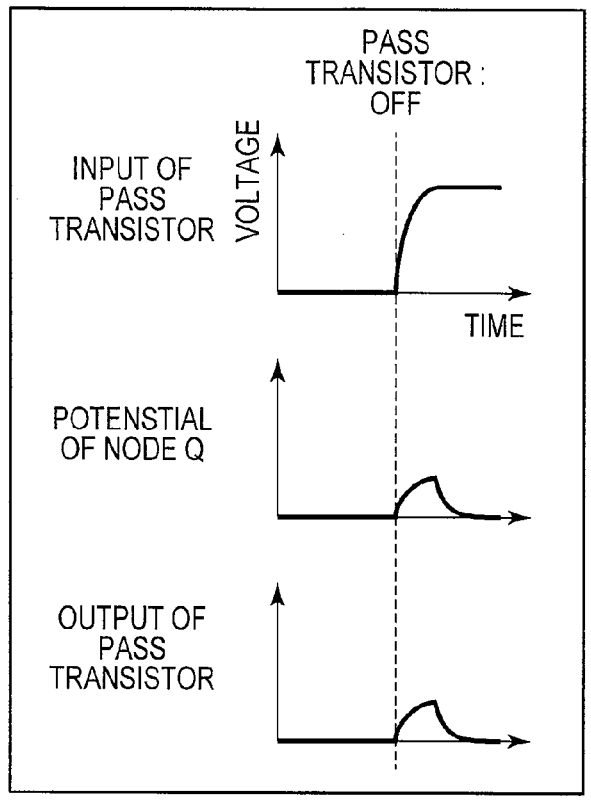

FIG. 39C illustrates a third situation.

In the second situation, memory transistor M11 is in erased state and memory transistor M21 is in written state, and the input signal to pass transistor PT1 changes from L to H. At this occasion, the pass transistor is in OFF state, but the potential of node Q fluctuates and increases, and it may be in ON state for a moment. For this reason, the signal of H which is not to be passed by pass transistor PT1 is passed, and this may cause the programmable logic switch to malfunction.

Figure 39D:
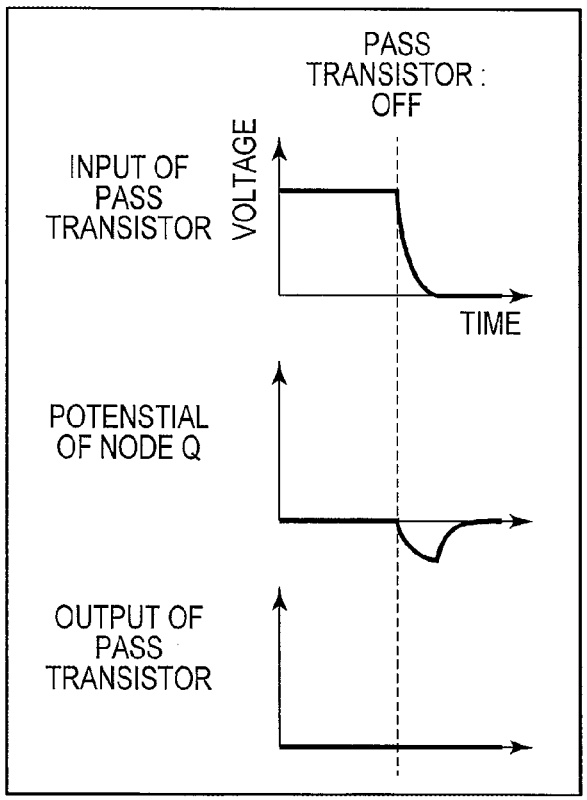

FIG. 39D illustrates a fourth situation.

In the fourth situation, memory transistor M11 is in erased state and memory transistor M21 is in written state, and the input signal to pass transistor PT1 changes from H to L. At this occasion, pass transistor is in OFF state, and therefore, even if the potential of node Q fluctuates to decrease, the ON/OFF state of pass transistor PT1 does not change.

As described above, the programmable logic switch may malfunction in the third situation. In the third situation, memory transistor M11 is in erased state and memory transistor M21 is in written state. This corresponds to a case where the ground potential is supplied to node Q via memory transistor M11. Accordingly, the channel width of memory transistor M11 is increased to enhance the driving force, so that it takes less time to return the potential back to original level when the potential of node Q fluctuates in the third situation.

On the other hand, even if the potential of node Q fluctuates in the first, second, fourth situations, the operation of the programmable logic switch is not affected. Therefore, the driving force of memory transistor M21 may be smaller than that of memory transistor M11. Accordingly, by setting W2 less than W1, the programmable logic switch can be prevented from malfunctioning without increasing the chip size.

The fact that the design values of W1 and W2 are different can be clarified by referring to CAD (Computer Aided Design) drawings used for designing lithography masks. In general, after the layouts of the patterns are made, correction such as OPC (Optical Proximity Correction) is made. To confirm the design values, the CAD drawings before the correction should be referred to.

In actual device manufacturing, the channel width after the processing varies due to the effect of, e.g., variation caused by the lithography machines, variation concerning a resist, variation caused by an underlayer deposited on a wafer. For example, according to 2009 edition of ITRS (International Technology Roadmap for Semiconductors), variation of the pattern size is set such that 3×σ (σ: standard deviation) stays within 10% of the average size while all of the above variations are taken into consideration.

Therefore, when the average value of W1 and the average value of W2 in the chip are denoted as W1 (ave), W2 (ave), respectively, a small difference between W1 (ave) and W2 (ave) may be buried in the variation. However, if W1 (ave) is larger than W2 (ave) by 10% or more, the effect of preventing malfunction of the programmable logic switch can be expected.

The values of W1 (ave) and W2 (ave) can be found by opening a manufactured chip and observing the shape of the gate electrode using an electron microscope and the like.

By setting W1 and W2 at different values, it is possible to confirm whether writing to each memory transistor is done (verification). In the present embodiment, for example, verification is performed by applying a predetermined verification voltage to word line WL1, and check the resistance value between bit lines BL1, BL2.

When both of memory transistors M11, M21 are in erased state, the resistance between bit lines BL1, BL2 is low. In contrast, when one of memory transistors M11, M21 is written and the channel resistance greatly changes, the resistance between bit lines BL1, BL2 is substantially equal to the channel resistance of the memory transistor which is written.

If memory transistors M11, M21 have the same structure, it is impossible to determine which memory transistor is written to from the resistance value between the bit lines. When W1 and W2 are different like the present embodiment, the channel resistances in written state are different between memory transistors M11 and M21, and therefore, it is possible to determine which memory transistor has been written to from the resistance value between the bit lines.

For the verification, W1 needs to be larger than W2 in every the programmable logic switch cell. Variation in the pattern size during manufacturing of the device is considered to be within 10%, and therefore, taking both of W1 variation and W2 variation into consideration, verification can be performed when W1 (ave) and W2 (ave) are different by 20% or more.

It should be noted that methods for enabling verification include not only a method for setting W1 and W2 as different lengths but also a method for setting the gate length of memory transistor M11 and the gate length of memory transistor M21 as different lengths and a method for setting both of the gate length and the channel width as different lengths in the two memory transistors.

However, threshold voltage Vth of the transistor is dependent upon the gate length. When memory transistor M11 and memory transistor M21 have different gate lengths, they are different from each other in Vth and VDsat, and it is necessary to change the write voltage depending on which of them are to be written to. This means that it is necessary to prepare many power supply voltages, which increases the cost.

In contrast, Vth and VDsat are not affected by change of the channel width, and therefore, the same write voltage can be used regardless of which memory transistor is written to.

In the explanation about the present embodiment, memory transistor M11 has a larger channel width than memory transistor M21. However, when, during operation of the programmable logic switch, bit line BL2 is connected to the ground potential and bit line BL1 is connected to the power supply potential, then the channel width of memory transistor M21 is set to be larger than that of memory transistor M11.

The writing method and the erasing method of the present embodiment may be the same method as the method explained in the first embodiment. The charge storage film and the block film of the present embodiment may be films satisfying the same conditions as the first embodiment.

As described above, according to any of the embodiments, the memory transistor can be selectively written, and threshold voltage Vth of the written memory transistor can be increased to a sufficiently high level, and moreover, back tunneling can be prevented when data are erased from the memory transistor. More specifically, according to any one of the embodiments, a programmable logic switch capable of writing and erasing without any malfunction can be achieved in a small size of area of the chip. According to any one of the embodiments, while increase in the size of area of the chip is suppressed, the effect of fluctuation of the potential of node Q caused by change of the input signal into the pass transistor can be reduced, and moreover, malfunction can be prevented.

(Technical Field to which the Embodiments can be Preferably Applied)

Each embodiment is particularly useful when the memory transistor and the logic transistor are provided in proximity in a mixed manner.

If the method for making the memory transistor and the method for making the logic transistor are greatly different, it is necessary to prepare separately a chip where the memory transistor is made and a chip where the logic transistor is made and to connect them later using external wirings. Alternatively, even if the memory transistor and the logic transistor are made in the same chip, the chip is to be roughly divided into two types of regions. In this case, multiple memory transistors are made in one of the regions, and multiple logic transistors are made in the other of the regions, and the distance between these regions need to be sufficiently large in order to suppress interference to the other of them when making one of them.

However, when the above embodiment is used, the memory transistor and the logic transistor can be made using similar process, and in each of them, superior characteristics can be obtained. Therefore, the memory transistor and the logic transistor can be made in proximity to each other in the same chip.

By the way, when one bit of information is represented using two memory transistors M11, M21, for example, the minimum size of area occupied by memory transistors M11, M21 including a space with an adjacent cell is roughly 7 F×10 F=70 $F^2$ making contact vias and the gates of transistors arranged in a layout with the same interval F.

Actually, all of them are not of the same size. Increase/decrease to some extent may occur, e.g., the gate length is smaller, and the contact is larger. However, when the gate length, which is the minimum processing size, is denoted as F, actual size of area is almost same as that mentioned above. On the other hand, the minimum size of area of SRAM is, for example, 120 $F^2$.

Now, a case where a pass transistor is arranged next to a memory transistor will be considered.

When the pass transistor is arranged in a direction parallel to the channel of the memory transistor, the interval between the memory transistor and the pass transistor should be set at a value equal to or more than 1 F but equal to or less than 7 F, so that the chip size is smaller than that of the SRAM (120 $F^2$).

When the pass transistor is arranged in a direction perpendicular to the channel of the memory transistor, the interval between the memory transistor and the pass transistor should be set at a value equal to or more than 1 F but equal to or less than 5 F, so that the chip size is smaller than that of the SRAM.

As described above, when the memory transistor and the pass transistor are arranged in proximity, the chip size can be reduced. At the same time, when the supply of power is resumed again after the supply of power to the programmable logic switch is shut off, the ON/OFF state of pass transistor PT1 can be controlled quickly in accordance with data stored in memory transistors M11, M21.

FIGS. 40A and 40B illustrate an example of concept of layout when the memory transistor and the logic transistor are provided in proximity in a mixed manner.

For example, as shown in FIG. 40A, multiple regions 52 including memory transistors made therein may exist separately in region 51 including logic transistors made therein. Alternatively, as shown in FIG. 40B, some number of regions 52 including memory transistors made therein may be put together, and may be arranged in a belt-like layout. In any case, as compared with a case where memory transistors are made in one area, the length of a wiring between a memory transistor and a logic transistor can be reduced, and the number of wirings can be reduced. Therefore, the chip size can be reduced, and the operation speed can be improved.

FIGS. 41 to 44 are figures illustrating an FPGA serving as an example of application.

As shown in FIG. 41, the FPGA of this example includes a tile area having tiles arranged in an array manner and an I/O area arranged around the tile area.

Each tile includes logic block LB for achieving basic logical function and switch block SB for determining connection/disconnection of logic block LB. As shown in FIGS. 42 to 44, a circuit constituting logic block LB or switch block SB includes memories. A logic achieved by the FPGA can be changed freely by rewriting data stored in the memories.

In a conventional FPGA, the memories as shown in FIGS. 42 to 44 are, for example, SRAMs. In contrast, in the FPGA of the present embodiment, at least one of the memories as shown in FIGS. 42 to 44 includes two memory transistors connected in series as shown in FIG. 2. Determination of logical function (selection of a signal path) can be made based on data stored in these memory transistors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a nonvolatile memory area comprising a first nonvolatile memory transistor, the first nonvolatile memory transistor comprising a first source diffusion region, a first drain diffusion region, and a first control gate electrode; and
a logic transistor area comprising a logic transistor whose conductive type is same as the first nonvolatile memory transistor, the logic transistor comprising a second source diffusion region, a second drain diffusion region, and a first gate electrode;
wherein:
the first nonvolatile memory transistor comprises a first charge storage film, and stores data by an amount of charges in the first charge storage film; and
a length of an overlapping area of the first source diffusion region and the first control gate electrode in a direction parallel to a channel of the first nonvolatile memory transistor is larger than a length of an overlapping area of the second source diffusion region and the first gate electrode in a direction parallel to a channel of the logic transistor.

2. The circuit of claim 1,
wherein the nonvolatile memory area and the logic transistor area are arranged on a substrate, and
a height of a lower surface of the first gate electrode from an upper surface of the substrate is lower than a height of a lower surface of the first control gate electrode from the upper surface of the substrate.

3. The circuit of claim 1,
wherein a gate length of the first nonvolatile memory transistor is longer than a gate length of the logic transistor.

4. The circuit of claim 1, wherein:
the nonvolatile memory area comprises a second nonvolatile memory transistor comprising a third source diffusion region, a third drain diffusion region, and a second control gate electrode;
the first and third drain diffusion regions are connected to an output line; and
the second nonvolatile memory transistor comprises a second charge storage film, and stores data by an amount of charges in the second charge storage film.

5. The circuit of claim 4,
wherein the first control gate electrode and the second control gate electrode are connected to a control terminal mutually.

6. The circuit of claim 1,
wherein the first charge storage film comprises one of a silicon nitride film and a silicon oxynitride film.

7. The circuit of claim 1,
wherein the logic transistor comprises first halo regions around the second source diffusion region and the second drain diffusion region, and each of the first halo regions has a polarity which is the same as a polarity of a channel of the logic transistor and has an impurity concentration higher than an average impurity concentration of the channel of the logic transistor.

8. The circuit of claim 7,
wherein the first nonvolatile memory transistor comprises second halo regions around the first source diffusion region and the first drain diffusion region, and each of the second halo regions has a polarity which is the same as a polarity of a channel of the first nonvolatile memory transistor and has an impurity concentration higher than an average impurity concentration of the channel of the first nonvolatile memory transistor.

9. The circuit of claim 1,
wherein the first source diffusion region includes phosphorus ions as donor ions, and the second source diffusion region includes arsenic ions as the donor ions.

10. The circuit of claim 8,
wherein impurity concentrations of the first halo regions are greater than impurity concentrations of the second halo regions.

11. The circuit of claim 1, wherein:
the nonvolatile memory area comprises a second nonvolatile memory transistor comprising a third source diffusion region, a third drain diffusion region, and a second control gate electrode;
the first and third drain diffusion regions are connected to an output line; and
in order to change the first and second nonvolatile memory transistors from an erased state to a written state, a first write voltage is applied to the first and second control gate electrodes, a second write voltage is applied to the first source diffusion region, and a third write voltage smaller than the second write voltage is applied to the third source diffusion region.

12. The circuit of claim 1, wherein:
the nonvolatile memory area comprises a second nonvolatile memory transistor comprising a third source diffusion region, a third drain diffusion region, and a second control gate electrode;
the first and third drain diffusion regions are connected to an output line; and
in order to change the first and second nonvolatile memory transistors from a written state to an erased state, a first erase voltage is applied to the first and second control gate electrodes, and a second erase voltage larger than the first erase voltage is applied to a well where the first and second nonvolatile memory transistors are arranged.

13. The circuit of claim 12,
wherein the first erase voltage is a negative voltage and the second erase voltage is a ground voltage.

14. The circuit of claim 12,
wherein the first erase voltage is a negative voltage and the second erase voltage is a positive voltage.

15. The circuit of claim 12, wherein:
in order to change the first and second nonvolatile memory transistors from the written state to the erased state, a third erase voltage is applied to the first and third source diffusion regions; and
an absolute value of a difference between the first and third erase voltages is larger than an absolute value of a difference between the first and second erase voltage.

16. A programmable logic device comprising:
a tile area comprising tiles arranged in an array; and
an I/O area arranged around the tile area;
wherein:
the tile comprises a logic block and a switch block for determining connection/disconnection of the logic block;
the logic block or the switch block comprises the circuit of claim 1;
the nonvolatile memory area comprises an output line connected to the first drain diffusion region;
the output line is connected to a logic switch circuitry comprising the logic transistor; and
the logic switch circuitry is controlled based on data stored in the first nonvolatile memory transistors of claim 1.

17. A method of manufacturing the circuit of claim 1, the method comprising:
forming the first source diffusion region by a first ion implantation; and
forming the second source diffusion region by a second ion implantation;
wherein the first and second ion implantations satisfy at least one of the following conditions:
I. an ion acceleration energy in the first ion implantation is larger than an ion acceleration energy in the second ion implantation, and
II. a total amount of dose of ion in the first ion implantation is larger than a total amount of dose of ion in the second ion implantation.

18. The circuit of claim 1,
wherein in order to change the first nonvolatile memory transistor from a written state to an erased state, a first erase voltage is applied to the first control gate electrode, and a second erase voltage larger than the first erase voltage is applied to a well where the first nonvolatile memory transistor is arranged.

19. The circuit of claim 18,
wherein the first erase voltage is a negative voltage and the second erase voltage is a ground voltage.

20. The circuit of claim 18,
wherein the first erase voltage is a negative voltage and the second erase voltage is a positive voltage.

21. The circuit of claim 18,
wherein in order to change the first nonvolatile memory transistor from the written state to the erased state, a third erase voltage is applied to the first source diffusion region, and
an absolute value of a difference between the first and third erase voltages is larger than an absolute value of a difference between the first and second erase voltage.

* * * * *